(12) United States Patent
Tange et al.

(10) Patent No.: US 11,195,870 B2
(45) Date of Patent: Dec. 7, 2021

(54) SEMICONDUCTOR APPARATUS AND DEVICE

(71) Applicant: CANON KABUSHIKI KAISHA, Tokyo (JP)

(72) Inventors: Tsutomu Tange, Yokohama (JP); Takumi Ogino, Koganei (JP); Hiroaki Kobayashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/803,791

(22) Filed: Feb. 27, 2020

(65) Prior Publication Data
US 2020/0286943 A1   Sep. 10, 2020

(30) Foreign Application Priority Data
Mar. 5, 2019   (JP) .............................. JP2019-039904

(51) Int. Cl.
*H01L 27/146*   (2006.01)
*H01L 23/00*   (2006.01)

(52) U.S. Cl.
CPC ........ *H01L 27/14636* (2013.01); *H01L 24/05* (2013.01); *H01L 27/14643* (2013.01); *H01L 27/14689* (2013.01)

(58) Field of Classification Search
CPC ............... H01L 27/14636; H01L 24/05; H01L 27/14643; H01L 27/14689; H01L 31/0224; H01L 25/50; H01L 31/09; H01L 2924/00014; H01L 2224/94
See application file for complete search history.

(56) References Cited

U.S. PATENT DOCUMENTS

| | | | |
|---|---|---|---|
| 2012/0187516 A1* | 7/2012 | Sato ...................... | H01L 24/80 257/443 |
| 2013/0105924 A1 | 5/2013 | Kobayashi et al. | |
| 2013/0112849 A1 | 5/2013 | Shimotsusa | |
| 2018/0138225 A1* | 5/2018 | Kim ................ | H01L 27/14618 |
| 2019/0123088 A1* | 4/2019 | Kwon ................... | H01L 24/92 |
| 2019/0157333 A1* | 5/2019 | Tsai ..................... | H01L 23/528 |
| 2019/0181119 A1* | 6/2019 | Xing .................. | H01L 25/0657 |
| 2019/0214423 A1* | 7/2019 | Kim ...................... | H01L 24/16 |
| 2019/0386051 A1* | 12/2019 | Hong .................... | H01L 24/13 |
| 2020/0083263 A1* | 3/2020 | Tanaka ............... | H01L 27/1464 |
| 2020/0091218 A1* | 3/2020 | Ikakura .............. | H01L 23/5329 |
| 2020/0251518 A1* | 8/2020 | Ogino ............... | H01L 27/14621 |
| 2021/0082787 A1* | 3/2021 | Shen ................. | H01L 23/5226 |

FOREIGN PATENT DOCUMENTS

| | | |
|---|---|---|
| JP | 2012019147 A | 1/2012 |
| WO | 2018/116559 A1 | 6/2018 |
| WO | 2018/189994 A1 | 10/2018 |

* cited by examiner

*Primary Examiner* — Douglas W Owens
(74) *Attorney, Agent, or Firm* — Canon U.S.A., Inc., IP Division

(57) ABSTRACT

A first conductive portion includes a first pad surrounded by a first insulator film in a plane perpendicular to a first direction, and a first via connected to the first pad so that the first via is positioned between the first pad and a first semiconductor layer in the first direction. A second conductive portion includes a second pad surrounded by a second insulator film in a plane perpendicular to the first direction, and a second via connected to the second pad so that the second via is positioned between the second pad and a second semiconductor layer in the first direction. The first and the second conductive portions are different in dimension.

21 Claims, 5 Drawing Sheets

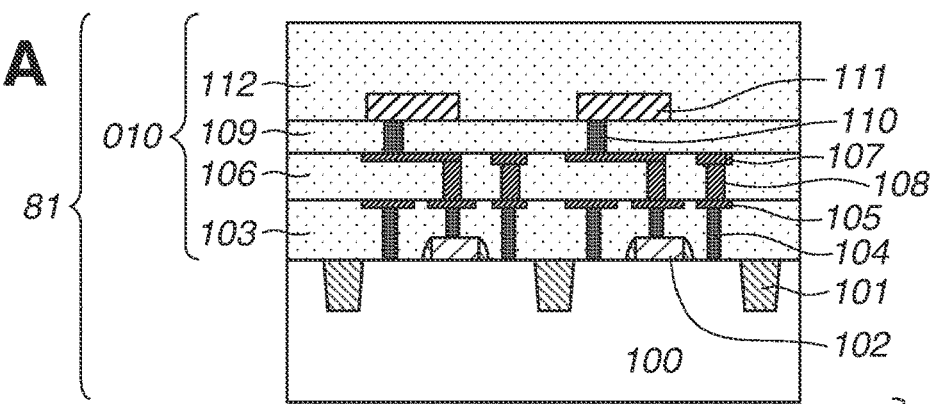
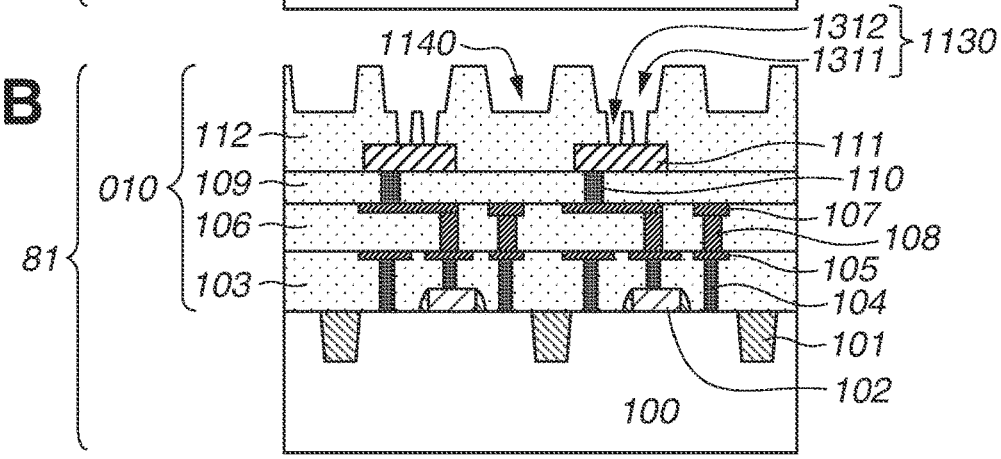
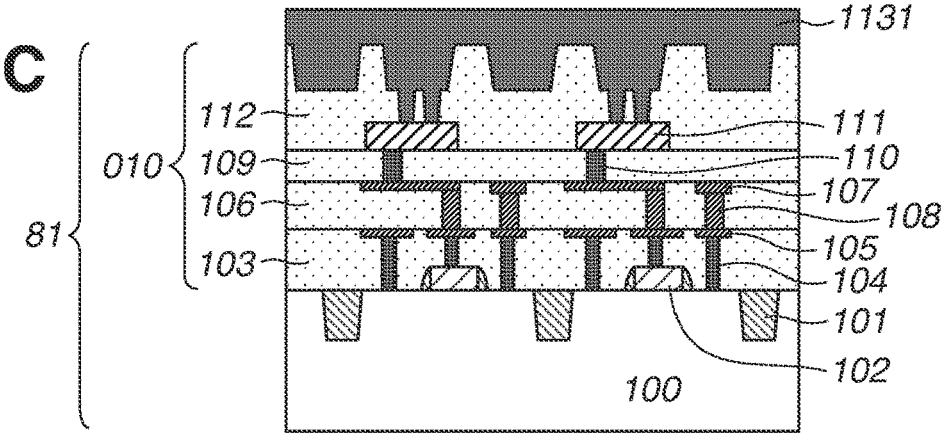
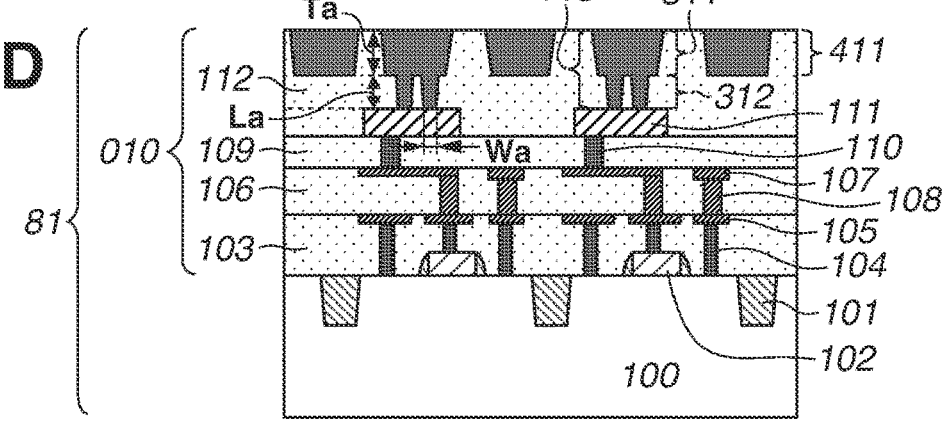

SEMICONDUCTOR APPARATUS AND DEVICE

BACKGROUND OF THE INVENTION

Field of the Invention

The present disclosure relates to a semiconductor apparatus including a plurality of semiconductor layers.

Description of the Related Art

In known semiconductor apparatuses, a plurality of semiconductor layers is stacked, and a plurality of conductive portions disposed between the plurality of semiconductor layers is bonded to each other. Japanese Patent Application Laid-Open No. 2012-19147 discusses a solid-state imaging apparatus in which bonding portions having a dual damascene structure are bonded to each other.

In the solid-state imaging apparatus discussed in Japanese Patent Application Laid-Open No. 2012-19147, the shape of bonding portions has not been sufficiently considered. Accordingly, there is room for improving the electrical and/or mechanical reliability of bonding.

SUMMARY OF THE INVENTION

The present disclosure is directed to providing a technique which is advantageous in improving the bonding reliability for a plurality of parts in a semiconductor apparatus. According to an aspect of the present disclosure, a semiconductor apparatus includes a first semiconductor component including a first semiconductor layer and a first insulator film over the first semiconductor layer, and a second semiconductor component including a second semiconductor layer and a second insulator film over the second semiconductor layer. The first and the second semiconductor layers are stacked so that the first and the second insulator films are positioned between the first and the second semiconductor layers in a first direction. The first and the second semiconductor components are bonded to each other by a first conductive portion disposed in a recessed portion formed in the first insulator film and a second conductive portion disposed in a recessed portion formed in the second insulator film. The first conductive portion includes a first pad surrounded by the first insulator film in a plane perpendicular to the first direction, and a first via connected to the first pad so that the first via is positioned between the first pad and the first semiconductor layer in the first direction, the first via being connected to a first conductor layer positioned between the first via and the first semiconductor layer in the first direction. The second conductive portion includes a second pad surrounded by the second insulator film in a plane perpendicular to the first direction, and a second via connected to the second pad so that the second via is positioned between the second pad and the second semiconductor layer in the first direction, the second via being connected to a second conductor layer positioned between the second via and the second semiconductor layer in the first direction.

Further features of the present disclosure will become apparent from the following description of exemplary embodiments with reference to the attached drawings.

BRIEF DESCRIPTION OF THE DRAWINGS

FIGS. 3A, 3B, 3C, and 3D schematically illustrate a method for manufacturing the semiconductor apparatus.

DESCRIPTION OF THE EMBODIMENTS

Figure 1A:
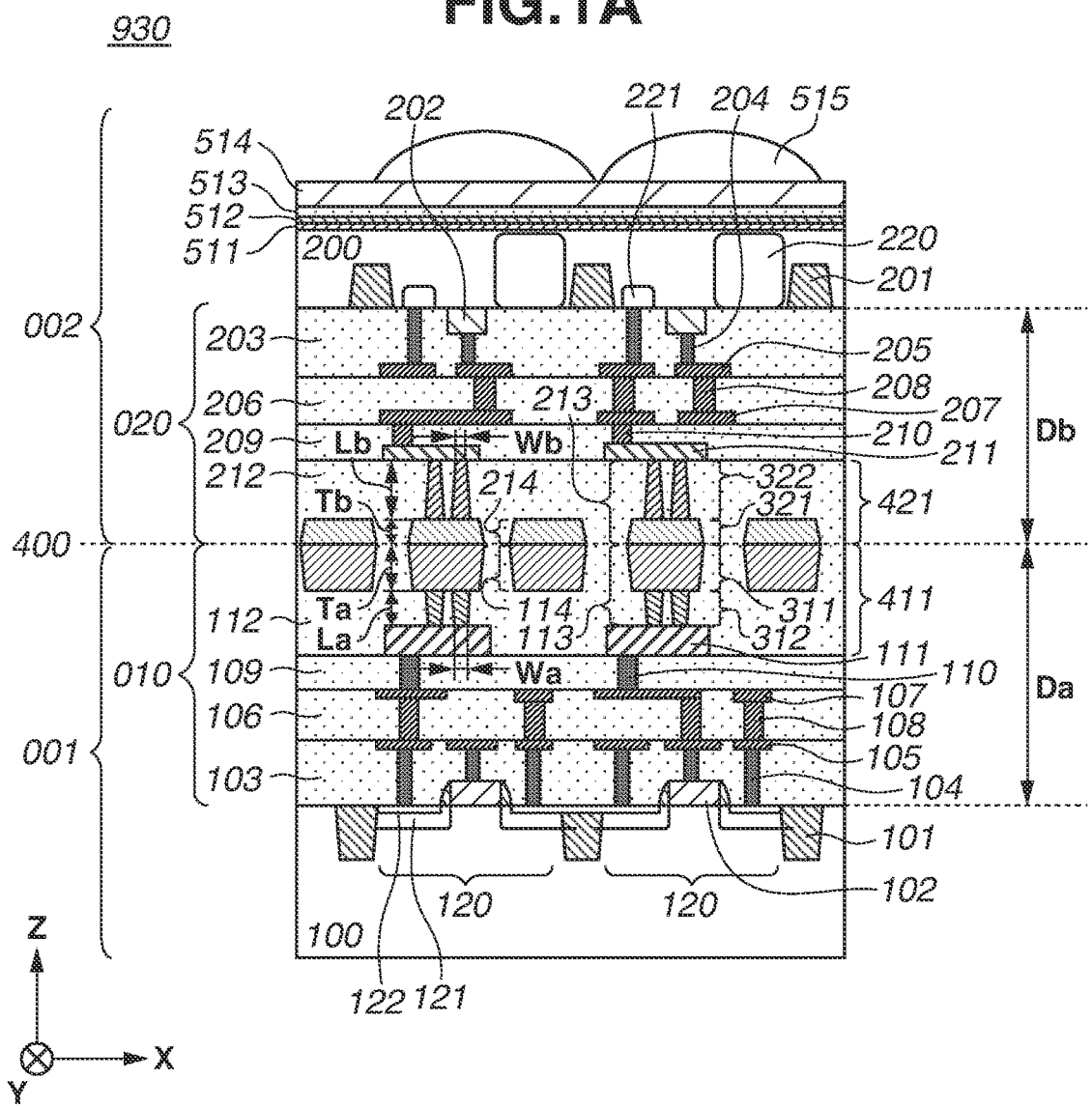
FIGS. 1A and 1B schematically illustrate a semiconductor apparatus.

An exemplary embodiment of the present disclosure will be described below with reference to the accompanying drawings. In the following descriptions and drawings, configurations common to a plurality of drawings are assigned the same reference numerals. Thus, common configurations will be described below with cross-reference to the plurality of drawings, and descriptions of configurations assigned the same reference numerals will be omitted as appropriate.

According to the present exemplary embodiment, the reliability is improved by adjusting the dimensions of conductive portions used for the bonding in a semiconductor apparatus 930 including two different semiconductor components (chips) bonded to each other. More specifically, the dimensions of vias and pads in the conductive portions are adjusted. The thicknesses of a via and a pad refer to the dimensions of the via and the pad, respectively, in a direction in which semiconductor layers included in each of the two semiconductor components are stacked (stacking direction). The stacking direction is perpendicular to the principal surfaces of the semiconductor layers included in each of the two semiconductor components. The widths of a via and a pad refer to the dimensions of the via and the pad, respectively, in the direction (in-plane direction) along the principal surfaces of the semiconductor layers included in the two semiconductor components.

FIG. 1A is a sectional view schematically illustrating the semiconductor apparatus 930. The semiconductor apparatus 930 includes semiconductor components 001 and 002. The semiconductor component 001 includes a semiconductor layer 100 and an insulator film 112 over the semiconductor layer 100. The semiconductor component 002 includes a semiconductor layer 200 and an insulator film 212 over the semiconductor layer 200. The semiconductor components 001 and 002 overlap with each other and are bonded to each other at a bonding surface 400. The semiconductor layers 100 and 200 are stacked so that the insulator films 112 and 212 are positioned between the semiconductor layers 100 and 200 in a stacking direction Z. Each of a plurality of conductive portions 113 is disposed in each of a plurality of recessed portions in the insulator film 112. Each of a plurality of conductive portions 213 is disposed in each of a plurality of recessed portions in the insulator film 212. The semiconductor components 001 and 002 are bonded to each other by the conductive portions 113 disposed in respective recessed portions in the insulator film 112 and the conductive portions 213 disposed in respective recessed portions in the insulator film 212.

The plane perpendicular to the stacking direction Z is an X-Y plane. The X-Y plane is a plane along the principal surface of the semiconductor layer 100 and/or the principal surface of the semiconductor layer 200. The X and Y directions are orthogonal to each other and parallel to the principal surface of the semiconductor layer 100 and/or the principal surface of the semiconductor layer 200. FIG. 1A illustrates a sectional view of the semiconductor apparatus 930 taken along the direction in which the semiconductor layers 100 and 200 are stacked (Z-axis direction).

Each of the conductive portions 113 includes a pad 311 and vias 312. The pad 311 is surrounded by the insulator film 112 in the X-Y plane. The vias 312 are connected to the pad 311 to be positioned between the pad 311 and the semiconductor layer 100 in the stacking direction Z. The vias 312 are connected to the conductor layer 111 positioned between the vias 312 and the semiconductor layer 100 in the stacking direction Z. The conductor layer 111 is in proximity to the vias 312. More specifically, the distance between each of the vias 312 and the conductor layer 111 is smaller than the distance between each of the vias 312 and the conductive portion 213. According to the present exemplary embodiment, the vias 312 contact the conductor layer 111 with a zero distance between each of the vias 312 and the conductor layer 111. A thin conductor layer may be disposed between the vias 312 and the conductor layer 111 so that the vias 312 are connected to the conductor layer 111 via the thin conductor layer. Typically, a barrier metal layer is used as the thin conductor layer which can be disposed between the vias 312 and the conductor layer 111.

Each of the conductive portions 213 includes a pad 321 and vias 322. The pad 321 is surrounded by the insulator film 212 in the X-Y plane. The vias 322 are connected to the pad 321 to be positioned between the pad 321 and the semiconductor layer 200 in the stacking direction Z. The vias 322 are connected to the conductor layer 211 between the vias 322 and the semiconductor layer 200 in the stacking direction Z. The conductor layer 211 is in proximity to the vias 322. More specifically, the distance between each of the vias 322 and the conductor layer 211 is smaller than the distance between each of the vias 322 and the conductive portion 113. According to the present exemplary embodiment, the vias 322 contact the conductor layer 211 with a zero distance between each of the vias 322 and the conductor layer 211. A thin conductor layer may be disposed between the vias 322 and the conductor layer 211 so that the vias 322 are connected to the conductor layer 211 via the thin conductor layer. Typically, a barrier metal layer is used as the thin conductor layer which can be disposed between the vias 322 and the conductor layer 211.

The semiconductor apparatus 930 includes wiring structures 010 and 020 disposed between the semiconductor layers 100 and 200. The semiconductor component 001 is a semiconductor component (semiconductor chip) including the semiconductor layer 100 and the wiring structure 010, and the semiconductor component 002 is a semiconductor component (semiconductor chip) including the semiconductor layer 200 and the wiring structure 020. Each of the wiring structures 010 and 020 includes a plurality of stacked wiring layers and a plurality of stacked insulating films (described below). Thus, the wiring structures 010 and 020 bonded to each other can also be referred to as a wiring structure portion in the semiconductor apparatus 930. The bonding of the semiconductor components 001 and 002 to each other forms the semiconductor apparatus 930.

The structure between the semiconductor layer 100 and the semiconductor component 002 (between the semiconductor layer 100 and the wiring structure 020) is the wiring structure 010. The wiring structure 010 includes the above-described conductive portions 113 and the conductor layer 111. In addition to the conductive portions 113 and the conductor layer 111, the wiring structure 010 can include via plugs 110, a wiring layer 107, via plugs 108, a wiring layer 105, and contact plugs 104 between the conductor layer 111 and the semiconductor layer 100. The wiring structure 010 also includes the above-described insulator film 112 and, in addition to the insulator film 112, can include interlayer insulating films 109, 106, and 103 between the insulator film 112 and the semiconductor layer 100.

The structure between the semiconductor layer 200 and the semiconductor component 001 (between the semiconductor layer 200 and the wiring structure 010) is the wiring structure 020. The wiring structure 020 includes the above-described conductive portions 213 and conductor layer 211. In addition to the conductive portions 213 and the conductor layer 211, the wiring structure 020 can include via plugs 210, a wiring layer 207, via plugs 208, a wiring layer 205, and contact plugs 204 between the conductor layer 211 and the semiconductor layer 200. The wiring structure 020 also includes the above-described insulator film 212 and, in addition to the insulator film 212, can include interlayer insulating films 209, 206, and 203 between the insulator film 212 and the semiconductor layer 200. Although the conductor layers 111 and 211 can also be referred to as wiring layers, these layers are referred to as the conductor layers 111 and 211 to distinguish these wiring layers in proximity to the vias 312 and 322 from other wiring layers. The via plugs 208 connect the wiring layers 205 and 207, and the via plugs 210 connect the wiring layer 207 and the conductor layer 211. Each of the conductive portions 213 has a damascene structure embedded in the recessed portion in the insulator film 212. At least part of the conductive portion 213 connects to the conductor layer 211. According to the present exemplary embodiment, the conductive portion 213 has a dual damascene structure and includes the pad 321 and the vias 322. The semiconductor components 001 and 002 are electrically connected with each other by the conductive portions 113 and 213. For the conductive portion 113 of the semiconductor component 001 and conductive portion 213 of the semiconductor component 002, the following dimensional relation between the pad and the vias may be satisfied. This enables preventing the detachment of the semiconductor components 001 and 002 from the bonding surface 400 under the influence of the thermal expansion of the conductive portion 113 or 213 in a heat process during manufacturing and when the temperature rises during operation. Thus, the bonding reliability in the semiconductor apparatus 930 can be improved. In the semiconductor apparatus 930 illustrated in FIG. 1A includes four different conductive portions each having vias and pads. If at least one conductive portion satisfies the above-described dimensional relation, the reliability at the bonding portion of the semiconductor apparatus 930 can be improved. As the number of conductive portions satisfying a relation (described below) increases, the reliability at the bonding portion of the semiconductor apparatus 930 improves to a further degree.

Although the conductive portions 113 and 213 are preferably mainly made of copper, the present invention is not limited thereto. The conductive portions 113 and 213 may be mainly made of gold or silver. The insulator films 112 and 212 are preferably mainly made of a silicon compound. The insulator films 112 and 212 may have a multilayer structure including a plurality of materials, such as a film structure with stacked layers including a layer (e.g., a silicon nitride layer) for preventing metal diffusion, a silicon oxide layer, and a low-k material layer. This multilayer structure enables preventing the influence of metal diffusion due to a bonding deviation between the conductive portions 113 and 213 caused by an alignment deviation occurring in bonding the semiconductor components 001 and 002. The insulator films 112 and 212 may be mainly made of resin.

The conductive portions 113 and the insulator film 112 are collectively referred to as a bonding member 411, and the conductive portions 213 and the insulator film 212 are collectively referred to as a bonding member 421. The bonding member 411 included in the semiconductor component 001 and the bonding member 421 included in the semiconductor component 002 are bonded to each other. The contact plugs 104, the wiring layers 105 and 107, the conductor layer 111, the conductive portions 113 and 213, the conductor layer 211, the wiring layers 207 and 205, and the contact plugs 204 are electrically continuous over the range from the semiconductor layer 100 to the semiconductor layer 200. These form the wiring (interlayer wiring) between the semiconductor layers 100 and 200. One end of the interlayer wiring may be connected to the gate electrode and the other end thereof may be connected to the source/drain electrode. Alternatively, one and the other ends of the interlayer wiring may be connected to the source/drain electrode.

In the semiconductor apparatus 930, the wiring structures 010 and 020 are bonded to each other. In more detail, the wiring structures 010 and 020 are bonded to each other at the bonding surface 400 formed by the bonding member 411 of the wiring structure 010 and the bonding member 421 of the wiring structure 020. The bonding surface 400 includes the surfaces of the bonding members 411 and 421.

Figure 1B:
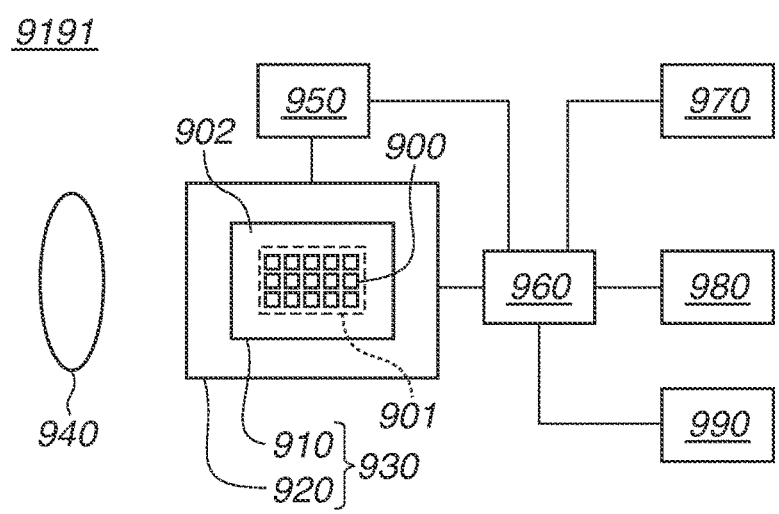

FIG. 1B schematically illustrates a device 9191 including the semiconductor apparatus 930. The semiconductor apparatus 930 includes a semiconductor device 910 including the semiconductor components 001 and 002, and can further include a package 920 for storing the semiconductor device 910. However, the semiconductor apparatus 930 does not need to include the package 920. The semiconductor layers 100 and 200 are included in the semiconductor device 910. According to the present exemplary embodiment, the semiconductor apparatus 930 is a photoelectric conversion apparatus (imaging apparatus). The semiconductor device 910 includes a pixel region 901 where pixel circuits 900 are arranged in matrix array, and a peripheral region 902 around the pixel region 901. Peripheral circuits and input/output terminals can be provided in the peripheral region 902. The semiconductor apparatus 930 is included in the device 9191. The device 9191 can include at least one of an optical apparatus 940, a control apparatus 950, a processing apparatus 960, a display apparatus 970, a storage apparatus 980, and a mechanical apparatus 990. The device 9191 will be described in detail below.

Figure 2A:
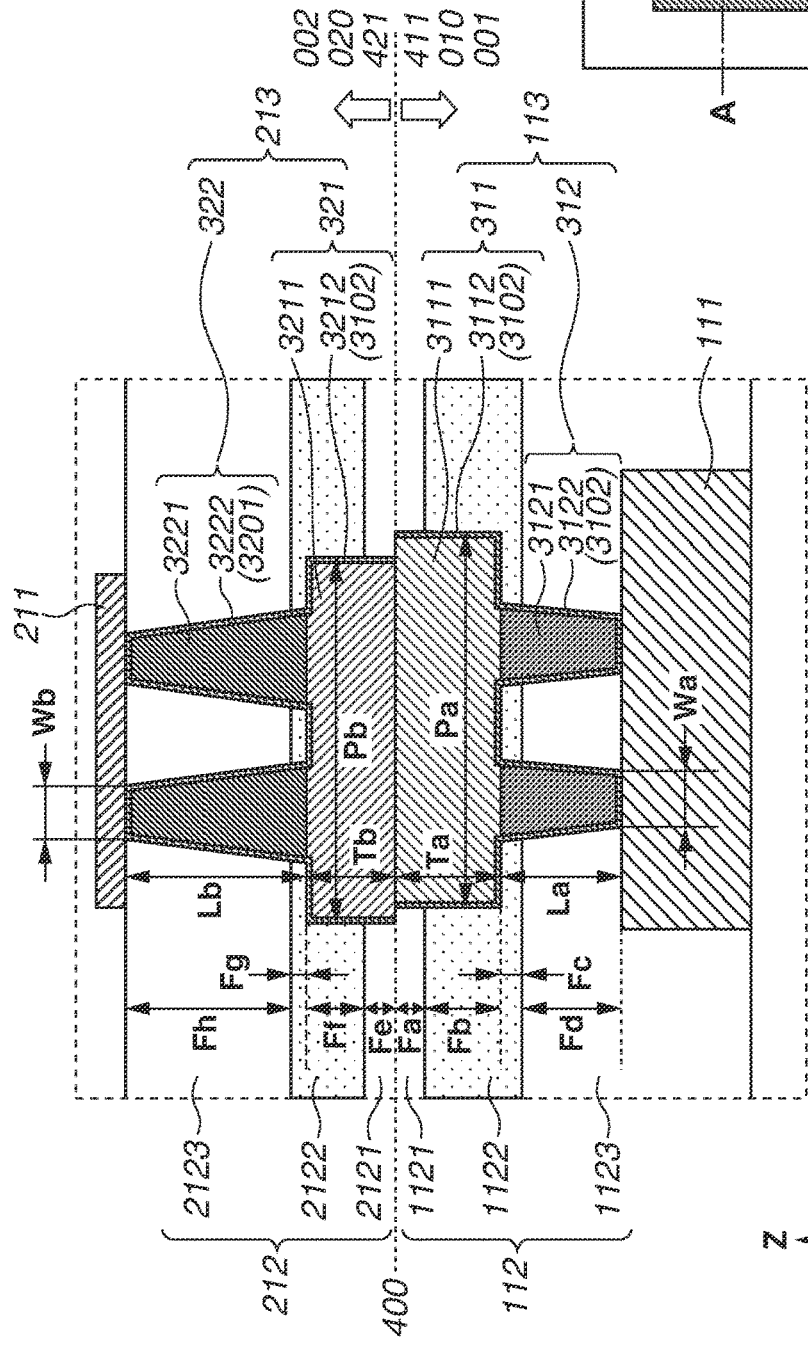
FIGS. 2A and 2B schematically illustrate the semiconductor apparatus.

The bonding between the wiring structure 010 of the semiconductor component 001 and the wiring structure 020 of the semiconductor component 002 will be described in detail below. FIG. 2A is an enlarged sectional view illustrating the bonding portion between the wiring structure 010 (bonding member 411) of the semiconductor component 001 and the wiring structure 020 (bonding member 421) of the semiconductor component 002. FIG. 2A is also an enlarged view illustrating the vicinity of the bonding surface 400 between the bonding members 411 and 421. The vias 312 have a length La in the stacking direction Z, and the vias 322 have a length Lb in the stacking direction Z. The pad 311 has a thickness Ta in the stacking direction Z, and the pad 321 has a thickness Tb in the stacking direction Z. The vias 312 have a width Wa in the in-plane direction X perpendicular to the stacking direction Z, and the vias 322 have a width Wb in the in-plane direction X. The pad 311 has a thickness Pa in the in-plane direction X, and the pad 321 has a thickness Pb in the in-plane direction X. The dimensions of the vias 312 and 322 and the pads 311 and 321 in the in-plane direction Y may be identical to or different from the dimensions in the in-plane direction X.

It is desirable to satisfy at least one of the following relations (A), (B), (C), (D), and (E):

$$La < Lb, \quad (A)$$

$$Wa > Wb, \quad (B)$$

$$La/Lb < Ta/Tb, \quad (C)$$

$$Pa/Pb < Wa/Wb, \text{ and} \quad (D)$$

$$La/Wa < Lb/Wb. \quad (E)$$

All the relations (A), (B), (C), (D), and (E) indicate factors which may relatively decrease the resistance of the vias 312, and factors which may relatively increase the resistance of the vias 322 when the stacking direction Z is set as the current flowing direction. For example, the relation (A) corresponds to that the resistance of the vias increases as the length thereof increases, not as decreases. The relation (B) corresponds to that the resistance of the vias increases as the width thereof increases, not as decreases. The relation (C) corresponds to that the difference in length of the vias is larger than the difference in thickness of the pad. When the relation (C) is transformed to La/Ta<Lb/Tb and standardized in terms of the thickness of the pad, the resultant formula means that the length La is relatively smaller than the length Lb. When Ta=Tb is applied to the relation (C), the relation (C) coincides with the relation (A). The relation (D) corresponds to that the difference in width between the vias is larger than the difference in width between the pads. When the relation (D) is transformed to Wb/Pb<Wa/Pa and standardized in terms of the thickness of the pad, the resultant formula means that the width Wa is relatively larger than the width Wb. When Pa=Pb is applied to the relation (D), the relation (D) coincides with the relation (B). The relation (E) indicates the relation of the ratio of the lengths of the vias to the widths of the vias corresponding to the resistance of the vias. When Wa=Wb is applied to the relation (E), the relation (E) coincides with the relation (A). When La=Lb is applied to the relation (E), the relation coincides with the relation (B). It is not essential that the resistance of the vias 312 is lower than that of the vias 322. Even in a case where the resistance of the vias 312 is higher than that of the vias 322, if any one of the above-described relations (A), (B), (C), (D), and (E) is satisfied, the difference in resistance between the vias 312 and 322 can be made smaller than that in a case where none of the above-described relations (A), (B), (C), (D), and (E) is satisfied.

It is desirable to satisfy at least one of the relations ($\alpha$) and ($\beta$) out of the following relations ($\alpha$), ($\beta$), ($\gamma$), and ($\delta$):
($\alpha$) The conductor layer 111 is mainly made of aluminum;
($\beta$) The conductor layer 211 is mainly made of copper:
($\gamma$) The conductor layer 111 is mainly made of copper, and
($\delta$) The conductor layer 211 is mainly made of aluminum.

In the following combination of the relations ($\alpha$), ($\beta$), ($\gamma$), and ($\delta$), the combination [$\alpha\beta$] satisfying the relations ($\alpha$) and ($\beta$) may be adopted. The combination [$\beta\gamma$] satisfying the relations ($\beta$) and ($\gamma$) may be adopted. The combination [$\alpha\delta$] satisfying the relations ($\alpha$) and ($\delta$) may be adopted. Since it is necessary to satisfy at least one of the relations ($\alpha$) and ($\beta$), the combination [$\gamma\delta$] satisfying none of the relations ($\alpha$) and ($\beta$) and satisfying the relations ($\gamma$) and ($\delta$) is not adopted. A case where the relation ($\alpha$) is satisfied will provide a structure in which the resistance of the conductor layer 111 tends to become higher than that in a case where the conductor layer 111 is mainly made of copper (relation ($\gamma$)).

A case where the relation (β) is satisfied will provide a structure in which the resistance of the conductor layer 211 tends to become lower than that in a case where the conductor layer 211 is mainly made of aluminum (relation (δ)). This is because the resistivity of aluminum (about 28 nΩm) is higher than that of copper (about 17 nΩm). The main component of the conductor layers indicates the element having the highest element concentration (atomic concentration) out of the elements (atoms) forming the conductor layer. For example, the conductor layer mainly made of aluminum may contain copper with a concentration lower than aluminum, and the conductor layer mainly made of copper may contain germanium with a lower concentration than copper.

The combination of the vias 312 and 322 with the conductor layers 111 and 211 connected thereto is considered. If the resistance of the vias 312 is higher than that of the vias 322, and the resistance of the conductor layer 111 is also higher than that of the conductor layer 211, the wiring resistance of the wiring structure 010 in the semiconductor component 001 is more likely to become higher than that of the wiring structure 020 in the semiconductor component 002. Then, unbalance occurs between the semiconductor components 001 and 002. Even if the resistance of the vias 312 is lower than that of the vias 322, and the resistance of the conductor layer 111 is also lower than that of the conductor layer 211, the wiring resistance of the wiring structure 010 in the semiconductor component 001 is more likely to become lower than that of the wiring structure 020 in the semiconductor component 002. Then, unbalance occurs between the semiconductor components 001 and 002.

Such unbalance can be reduced by satisfying at least one of the following relations (A), (B), (C), (D), and (E) and satisfying at least one of the relations (α) and (β). More specifically, the unbalance can be reduced by making the resistivity of the conductor layer 111, to which the vias 312 having a relatively lower resistance out of the vias 312 and 322 are connected, higher than that of the conductor layer 211 (combination [αβ]). Alternatively, the unbalance can be reduced by making the resistivity of the conductor layer 111, to which the vias 312 having a relatively lower resistance out of the vias 312 and 322 are connected, identical to that of the conductor layer 211 (combination [βγ] or [αδ]).

The following relation (F) can be satisfied:

$$La/Wa > Lb/Wb. \quad (F)$$

The relation (F) is opposite to the relation (E). When the relation (F) is transformed, the relation La/Lb>Wa/Wb results.

The following relation (G) may also be satisfied:

$$Ta > Tb. \quad (G)$$

It is desirable that both the relations (G) and (A) is satisfied to prevent the thickness of the conductive portion 113 and the thickness Tb+Lb of the conductive portion 213 from being largely different from each other in the case of different thicknesses of the pads 311 and 321 according to the relation (G).

The following relation (H) may also be satisfied:

$$La*Ta > Lb*Tb. \quad (H)$$

When La is equal to Lb (La=Lb) in the relation (H), the relation (H) coincides with the relation (G). This means that, when both relations (A) and (H) are satisfied, Ta needs to be much larger than Tb (Ta>>Tb).

The following relation (I) may also be satisfied:

$$La - Lb < Ta - Tb. \quad (I)$$

When the relation (I) is transformed, the relation La−Ta<Lb−Tb results. This means, for example, that the conductive portion 113 has a smaller difference between the thickness of the pad and the length of each of the vias than the conductive portion 213. When Ta is equal to Tb (Ta=Tb) in the relation (I), the relation (I) coincides with the relation (A).

It is also desirable to satisfy the following relation (J):

$$La + Ta < Lb + Tb. \quad (J)$$

The relation (J) means that the length (thickness) of the conductive portion 113 is smaller than the length (thickness) of the conductive portion 213. This enables reducing the variation of the length (thickness) of the conductive portion 113, thus improving the bonding reliability, compared with the combination [γδ]. When Ta is equal to Tb (Ta=Tb) in the relation (J), the relation (J) coincides with the relation (A).

Satisfying at least one of the above-described relations (G), (H), (I), and (J) enables preventing the detachment on the bonding surface 400 due to the force occurring when the conductive portions 113 and 213 thermally expand in the stacking direction or preventing bonding failures during bonding. When any one of the relations (A), (C), (G), (H), (I), and (J) is satisfied, the relation (F) may also be satisfied.

It is also desirable to satisfy the following relation (K):

$$|Ta - Tb| < |La - Lb|. \quad (K)$$

The relation (K) means that the difference in thickness between the pads 311 and 321 is relatively small. The mechanical reliability of the bonding surface 400 is ensured mainly by the pads 311 and 321. If, however, the pads 311 and 321 are largely different in thickness, the amount of thermal expansion of the pads 311 and 321 in the stacking direction will be different, degrading the mechanical reliability of the bonding.

Specific examples of the dimensions of each part of the conductive portions 113 and 213 will be described below. La and Lb are 0.7 to 0.9 μm, Wa and Wb are 0.3 to 0.8 μm, Pa and Pb are 0.5 to 4 μm, and Ta and Tb are 0.4 to 0.6 μm. The difference between La and Lb is 0.04 to 0.08 μm, the differences between Wa and Wb is 0 to 0.05 μm, the difference between Pa and Pb is 0 to 0.5 μm, and the difference between Ta and Tb is 0 to 0.1 μm. As a more specific combination, La=0.77 μm, Lb=0.83 μm. Wa=0.39 μm, Wb=0.39 μm, Pa=3.0 μm, Pb=3.0 μm, Ta=0.51 μm, and Tb=0.51 μm, resulting in a relation Pa=Pb>Lb>La>Ta=Tb>Wa=Wb. This combination satisfies the above-described relations (A), (C), (E), (I), and (J). In particular, the bonding reliability can be improved particularly when the combination [αβ] is satisfied.

The conductor layer 111 can be formed through patterning based on the photolithography and the etching techniques after depositing an aluminum film through, for example, the Physical Vapor Deposition (PVD) method. Subsequently, the insulator film 112 is deposited on the patterned conductor layer 111, and the uppermost surface of the insulator film 112 is flattened through the Chemical Mechanical Polishing (CMP) method. When the conductor layer 211 is mainly made of copper, the conductive layer 211 is formed to be embedded in a recessed portion of the interlayer insulating film 209 through a damascene process. Thus, the underneath of the insulator film 212 has larger unevenness than the approximately flat surface formed by the interlayer insulating film 209 and the conductive layer 211 as the underneath of the insulator film 112. Therefore, there is a concern that the flatness of the insulator film 112 in the wafer surface becomes lower than that of the insulator film 212 formed on the conductor layer 211, under the influence of the conductor layer 111. In the wafer surface, this influence may cause a larger variation of the length La of the via 312 forming the conductive portion 113 than the variation of the length Lb of the via 322 forming the conductive portion 213. There is another concern about the decrease in the variation of the width Wa at contact portions between the conductor layer 111 and the via 312, and the increase in a contact resistance attendant thereon. The contact resistance between the conductor layer 111 made of aluminum and the vias 312 made of copper is larger than that between the conductor layer 211 made of copper and the vias 322 made of copper. The decrease in the variation of the width Wa of the vias 312 will influence the increase and the variation decrease in the contact resistance between the conductor layers 111 and 211 via the conductive portions 113 and 213, respectively.

In bonding the semiconductor components 001 and 002 to each other to electrically connect the conductive portions 113 and 213, heat processing at about 300 to 400 degrees Celsius can be performed. The variation in the length La of the vias 312 in the wafer surface influences the thermal expansion of Cu of the trenches and the vias in the conductive portions during the heat processing. There has been a concern that, depending on the volumetric relation between the trench and the vias, the influence of the volumetric variation of the vias increases and causes the detachment from the bonding surface 400.

According to the exemplary embodiment, adopting the relation (A) La<Lb relatively reduces the length La, making it possible to reduce the influence of the variation of the width Wa of the vias 312. Reducing the length La relatively decreases the volumes of the vias 312 with respect to the volumes of the trenches in the conductive portion 113. This enables relatively reducing the influence of the volumetric variation of the vias 312 in the thermal expansion of copper of the pads and the vias in the conductive portions, thus preventing the detachment on the bonding surface 400 due to the influence of the thermal expansion of the conductive portions. Moreover, adopting the relation (B) Wa>Wb enables preventing a variation decrease and an increase in the contact resistance of wiring. Adopting the relation (G) Ta>Tb relatively reduces the volume of the vias 312 with respect to the volume of the pad 311 of the conductive portion 113. This enables relatively reducing the influence of the volumetric variation of the vias 312 in the thermal expansion of copper of the pad 311 and the vias 312 in the conductive portion 113, thus preventing the detachment on the bonding surface 400 due to the influence of the thermal expansion of the conductive portion 113. The conductor layer 111 is not limited to an aluminum layer and may be a copper layer.

Adopting the relation (C) La/Lb<Ta/Tb, which means that the ratio of the length La to the length Lb is made smaller than the ratio of the thickness Ta to the thickness Tb, enables preventing the detachment on the bonding surface 400 due to the influence of the thermal expansion of the conductive portions. Adopting the relation (K) |Ta−Tb|<|La−Lb|, which means that the difference between the lengths La and Lb is made larger than the difference between the thicknesses Ta and Tb, enables preventing the detachment on the bonding surface 400 due to the influence of the thermal expansion of the conductive portions. This is because the volumes of the vias are relatively smaller than the volumes of the trenches in the conductive portions 113 and 213. In the case of La<Lb, that is, making the ratio of the length La to the length Lb larger than the ratio of the thickness Tb to the thickness Ta (Tb/Ta<La/Lb) enables preventing the detachment on the bonding surface 400 under the influence of the thermal expansion of the conductive portions. When Tb/Ta<La/Lb is transformed to La*Ta>Lb*Tb, this coincides with the relation (H). Further, making the difference between the lengths La and Lb larger than the difference between the thicknesses Ta and Tb (|Ta−Tb|<|La−Lb|) enables preventing the detachment on the bonding surface 400 due to the influence of the thermal expansion of the conductive portions. This is because the volumes of the vias are relatively smaller than the volumes of the trenches in the conductive portions 113 and 213.

In the heat processing for solid wafer bonding, satisfying the above-described relations enables preventing the detachment from the bonding surface 400 due to the influence of the thermal expansion of the conductive portions, thus improving the bonding reliability in the semiconductor apparatus. The above-described relations also enable preventing the increase and the variation decrease in the contact resistance between the conductive portion and the wiring layer.

Depending on the volume of the conductive portions, the detachment from the bonding surface 400 may occur due to the influence of the thermal expansion of the conductive portions. At the bonding portion where the trench and the vias are formed, an increase in the junction resistance between the vias and the wiring and the increase in the resistance variation may possibly occur depending on the structure of the wiring layer electrically connected with the vias and the length of the vias. According to the present exemplary embodiment, for example, in a case where the conductor layer 111 is an aluminum layer and the conductor layer 211 is a copper layer, the thicknesses of the vias 312 and 322 are defined to satisfy the relation (A) La<Lb. Defining the widths of the vias 312 and 322 to satisfy the relation (B) Wa>Wb enables reducing the junction resistance between the bonding portion and the wiring layer to prevent the resistance variation while improving the reliability of the bonding portion in the semiconductor apparatus. Alternatively, defining the thicknesses of the pads 311 and 321 to satisfy the relation (G) Ta>Tb enables reducing the junction resistance between the bonding portion and the wiring layer to prevent the resistance variation while improving the reliability of the bonding portion in the semiconductor apparatus. The conductor layer 111 is not limited to an aluminum layer.

Making the ratio of the length La to the length Lb smaller than the ratio of the thickness Ta to the thickness Tb (La/Lb<Ta/Tb) to satisfy the relation (C) enables preventing the detachment from the bonding surface 400 due to the influence of the thermal expansion of the conductive portions. Further, adopting the relation (I) La−Lb<Ta−Tb, which means that the difference between the lengths La and Lb is made larger than the difference between the thicknesses Ta and Tb, enables preventing the detachment from the bonding surface 400 due to the influence of the thermal expansion of the conductive portions. This is because the volumes of the vias are relatively smaller than the volumes of the trenches in the conductive portions 113 and 213. Further, when the lengths of the vias 312 and 322 are defined to satisfy the relation (A) La<Lb, the definition is made to satisfy the relation (H) Tb/Ta<La/Lb, which means that the ratio of the length La to the length Lb is larger than the ratio of the thickness Tb to the thickness Ta. This enables preventing the detachment from the bonding surface 400 due to the influence of the thermal expansion of the conductive portions. Further, satisfying the relation (K) |Ta−Tb|<|La−Lb|, which means that the difference between the lengths La and Lb is made larger than the difference between the thicknesses Ta and Tb, enables preventing the detachment on the bonding surface 400 due to the influence of the thermal expansion of the conductive portions. This is because the volumes of the vias are relatively smaller than the volumes of the trenches in the conductive portions 113 and 213.

The conductive portions 113 and 213 are desirably mainly made of copper, the present invention is not limited thereto. The conductive portions 113 and 213 may be mainly made of a metal having high spreadability, such as gold and silver. The insulator films 112 and 212 are desirably mainly made of a silicon compound. The insulator films 112 and 212 may have a multilayer structure made of a plurality of materials, such as a multilayer film structure having the stacking of a layer for preventing metal diffusion (e.g., a silicon nitride layer and a silicon carbide layer) and a silicon oxide layer. This configuration enables preventing the influence of metal diffusion due to the bonding deviation of the conductive portions 113 and 213 caused by the alignment deviation occurring when bonding the semiconductor components 001 and 002 to each other. The insulator films 112 and 212 may be mainly made of resin.

The wiring structure 010 includes an interlayer insulating film 103, a contact plug 104, the wiring layer 105, an interlayer insulating film 106, the wiring layer 107, a via plug 108, an interlayer insulating film 109, a via plug 110, and the conductor layer 111. The wiring structure 010 further includes the insulator film 112 disposed on the conductor layer 111. The wiring structure 010 further includes a plurality of the conductive portions 213, the insulator film 112, and the plurality of the conductive portions 113. The bonding member 411 is part of the wiring structure 010 and includes the insulator film 112 and the plurality of the conductive portions 113. Typically, the thermal expansion coefficient of the conductive portions 113 is larger than that of the insulator film 112, and the thermal expansion coefficient of the conductive portions 213 is larger than that of the insulator film 212. The via plug 108 connects the wiring layers 105 and 107, and the via plug 110 connects the wiring layer 107 and the conductor layer 111.

Figure 2B:
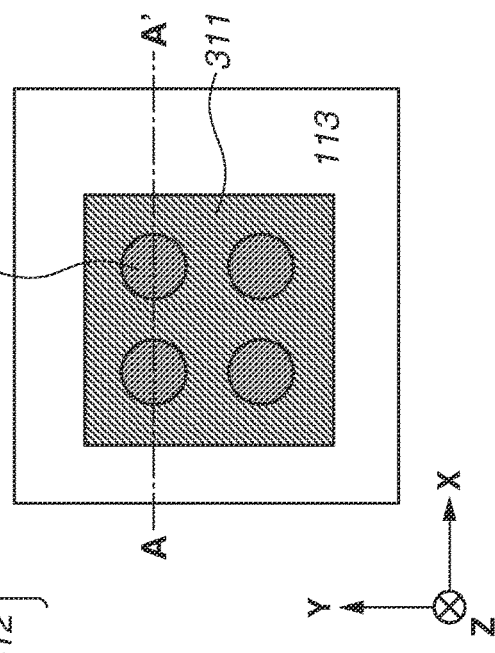

The plurality of the conductive portions 113 has a damascene structure embedded in respective recessed portions in the insulator film 112, and is used to electrically connect the semiconductor component 001 to the semiconductor component 002. Each of the conductive portions 113 includes the pad 311 and the vias 312. One pad 311 is surrounded by the insulator film 112 in the X-Y plane. The contour of one pad 311 coincides with the contour of the insulator film 112 surrounding the one pad 311. Ma vias 312 (Ma is a natural number) are connected to one pad 311 included in each conductive portion 113. While Ma is 4 as illustrated in FIG. 2B in the present exemplary embodiment, Ma may be 1 or 2. The above-described length La and width Wa indicate the length and the width of one via out of the Ma vias 312. In the case of Ma>2, when one via has the length La and the width Wa, another via does not necessarily need to coincide with the length La and the width Wa but it is desirable that the other vias coincide with the length La and the width Wa. The Ma vias 312 are positioned between the pad 311 and the semiconductor layer 100 in the stacking direction Z. More specifically, the Ma vias 312 are positioned in the orthogonal projection from one pad 311 to the principal surface of the semiconductor layer 100. The width of one via 312 is larger than the width of one pad 311. Each of the Ma vias 312 is surrounded by the insulator film 112 in the X-Y plane. The insulator film 112 exists between any adjacent two of the Ma vias 312. The contour of one via 312 coincides with the contour of the insulator film 112 surrounding the one via 312. According to the present exemplary embodiment, it is desirable that the thickness of the vias 312 is larger than the thickness of the pad 311. The term "thickness" according to the present exemplary embodiment refers to the dimension in the Z-axis direction. The conductive portion 113 is connected with the conductor layer 111 made of aluminum. More specifically, at least part of the vias 312 is connected with the conductor layer 111. For example, the pad 311 and the vias 312 of the conductive portion 113 are formed in a dual damascene structure, and are mainly made of copper (Cu). As illustrated in FIG. 1A, the bonding member 411 can have the conductive portion 114 in a single damascene structure having a pad and no vias. As illustrated in FIG. 1A, the bonding member 421 can have the conductive portion 214 with a single damascene structure having a pad and no vias. The bonding between the semiconductor components 001 and 002 can be strengthened to a further extent through the bonding between the conductive portions 214 and 114.

To bond the semiconductor components 001 and 002 to each other to electrically connect the conductive portions 113 and 213, it is desirable to perform heat processing at around 300 to 400 degrees Celsius. There is, however, a concern that, the influence of the thermal expansion of the vias 312 increases and causes the detachment from the bonding surface 400 in the heat processing, depending on the volumetric relation between the pad 311 and the vias 312. In some manufacturing processes (film formation, etching, and annealing) after the bonding, heat processing at about 100 to 400 degrees Celsius can be performed. In the heat processing, there is also a concern that the influence of the thermal expansion of the vias 312 increases and causes the detachment from the bonding surface 400. The semiconductor apparatus 930 may be used, for example, under the environment at around 0 degrees Celsius. In such a case, the temperature of the semiconductor apparatus 930 may increase to around 80 degrees Celsius by the heat generation in the semiconductor apparatus 930 during operation. The durability to such a temperature cycle is also demanded. The inventors consider that more desirable bonding is obtained with a relatively smaller ratio of the volume of the pad 311 to the volume of the vias 312 and that decreasing the ratio of the volume of the vias 312 to the volume of one pad 311 is effective. It is presumed that such volumetric nonuniformity in the conductive portions degrades the bonding reliability.

As illustrated in FIG. 2A, the bonding member 411 includes the conductor layer 111, the insulator film 112, and the conductive portion 113. As described above with reference to FIG. 2A, the semiconductor component 001 includes semiconductor components, such as transistors, a plurality of wiring layers on the semiconductor components, and the conductor layer 111 as the uppermost layer of the plurality of wiring layers. The conductive portion 113 is connected with the conductor layer 111. The conductive portion 113 includes the pad 311 and the vias 312. For example, the pad 311 and the vias 312 in the conductive portion 113 are formed in a dual damascene structure and made of copper (Cu). Thus, each of the plurality of the conductive portions 113 includes a copper region 3111 (copper portion) mainly made of copper for forming the pad 311, and a copper region 3121 (copper portion) mainly made of copper for forming the vias 312. The copper region 3111 is continuous to the copper region 3121. The pad 311 and the vias 312 are provided with a barrier metal film 3102 at the portion in contact with the insulator film 112, indicated by bold lines surrounding the conductive portion 113 in FIG. 2A. The barrier metal film 3102 is made of tantalum (Ta), a tantalum compound, titanium, or a titanium compound. The barrier metal film 3102 includes a barrier metal portion 3112 which is a portion between the copper region 3111 and the insulator film 112, and a barrier metal portion 3122 which is a portion between the copper region 3121 and the insulator film 112. The barrier metal portion 3112 is continuous to the barrier metal portion 3122. As described above, the pad 311 and the vias 312 are provided with a copper (Cu) portion surrounded by a barrier metal. While the pad 311 has a square pole shape in the present exemplary embodiment, and the vias 312 have a frusto-conical shape, the shapes are not limited thereto. More specifically, the pad 311 and the vias 312 may have various shapes, such as the column, frusto-conical, square pole, and square pyramid shapes.

The bonding portion as a part of the wiring structure 020 includes the conductor layer 211, the insulator film 212, and the conductive portion 213. The conductive portion 213 includes the pad 321 and the vias 322. As in the insulator film 112, the insulator film 212 may be formed of three different insulator layers.

FIG. 2B illustrates an example where four different vias 312 connect to the pad 311. To bond the bonding members 411 and 421 (semiconductor components 001 and 002, respectively) to each other to electrically connect the conductive portions 113 and 213, it is necessary to perform heat processing at around 300 to 400 degrees Celsius. In the heat processing, there is, however, a concern that, depending on the volumetric relation between the pad and the vias in the conductive portion, the influence of the volumetric thermal expansion of the vias increases and causes the detachment on the bonding surface 400. When comparing the insulator film 112 and the vias 312 under the pad 311, the thermal expansion coefficient of the vias 312 is larger than that of the insulator film 112. Thus, to reduce the influence of the thermal expansion under the pad 311, it is more effective to reduce the volume of the vias 312 than to reduce the volume of the insulator film 112 positioned under the pad 311.

The configuration of the conductive portion 113 will be described in detail below. The conductive portion 113 includes the copper region 3111 mainly made of copper for forming the pad 311, and the copper region 3121 mainly made of copper for forming the vias 312. The conductive portion 113 includes the barrier metal portion 3112 between the copper region 3111 and the insulator film 112, and the barrier metal portion 3122 between the copper region 3121 and the insulator film 112. The copper region 3111 is continuous to the copper region 3121. The barrier metal portion 3112 is continuous to the barrier metal portion 3122. The barrier metal portions 3112 and 3112 are parts of the continuous barrier metal film 3102.

The insulator film 112 can be a stacked film including the insulator layers 1121, 1122, and 1123. The insulator layer 1123 is disposed between the insulator layer 1121 and the semiconductor layer 100 in the stacking direction Z. The insulator layer 1122 is disposed between the insulator layers 1121 and 1123 in the stacking direction Z. The insulator layer 1121 surrounds the pad 311 in the X-Y plane. The insulator layer 1123 surrounds the vias 312 in the X-Y plane in the stacking direction Z. The insulator layer 1122 includes a pad surrounding portion which surrounds the pad 311 in the X-Y plane. The insulator layer 1122 includes the via surrounding portion positioned between the insulator layer 1123 and the pad 311 in the X-Y plane.

The insulator layers 1121 and 1123 are silicon oxide layers mainly made of silicon (Si) and O (oxygen). The insulator layer 1122 is a silicon nitride layer mainly made of silicon (Si) and N (nitrogen). The insulator layer 1122 may be a silicon carbide layer mainly made of silicon (Si) and carbon (C). The silicon oxide layer can contain Si, O, and element(s) other than light elements. Examples of the element(s) other than the light elements include carbon (C), nitrogen (N), fluorine (F), chlorine (Cl), argon (Ar), boron (B), phosphorus (P), and sulfur (S) with a smaller concentration than Si and O. The silicon nitride layer can contain Si, N, and any of the element(s) other than the light elements, such as carbon (C), oxygen (O), fluorine (F), chlorine (Cl), argon (Ar), boron (B), phosphorus (P), and sulfur (S), with a smaller concentration than Si and N. The silicon oxide layer, the silicon nitride layer, and the silicon carbide layer can contain light elements, such as hydrogen (H), with a larger or smaller concentration than Si, O, N, and C. As described above, the insulator layer 1122 mainly made of an element different from the main component of the insulator layer 1121 can operate as an etching stopper in forming a trench corresponding to the pad 311 through etching. More specifically, the presence of the insulator layer 1122 makes it possible to form the pad 311 and the vias 312 with suitable thicknesses. The insulator layer 1122 as a silicon nitride layer or silicon carbide layer included in the insulator film 112 prevents copper contained in the conductive portion 213 of the bonding member 421 as a member to be bonded from diffusing into the insulator layer 1123. Similarly, the insulator layer as a silicon nitride layer or silicon carbide layer contained in the insulator film 212 prevents copper contained in the conductive portion 113 from diffusing.

As illustrated in FIG. 2A, it is defined that the insulator layer 1121 has a thickness Fa, and the pad surrounding portion surrounding the pad 311 in the insulator layer 1122 has a thickness Fb. Further, it is defined that the via surrounding portion surrounding the vias 312 and overlapping with the pad 311 in the insulator layer 1122 has a thickness Fc, and the portion surrounding the around vias 312 and overlapping with the pad 311 (when viewed from the stacking direction Z) in the insulator layer 1123 has a thickness Fd. In the etching of the insulator film 112 in forming a recessed portion (trenches and holes to be described below) where the conductive portion 113 is disposed, the insulator film 112 may be etched so that the thickness Fe is 0. However, it is desirable to form and etch each insulator layer so that at least two of Fa, Fb, Fc, and Fd satisfy at least a part of the relation Fd>Fb>Fa≥Fe>0. For example, at least one of Fa<Fd, Fc<Fb, Fa<Fb, and Fe<Fd may be satisfied. The relation Fa<Fd indicates the comparison of the thicknesses of the two silicon oxide layers (insulator layers 1121 and 1123). To prevent the metal (copper) of the conductive portion 113 from diffusing into the insulator layer 1121 in proximity to the bonding surface 400, it is desirable that the insulator layer 1121 is thin. To improve the flatness of the insulator layer 1122 in proximity to the conductor layer 111 compared with other insulator layers 1121 and 1122, it is desirable that the insulator layer 1122 is thick. As a result, the relation Fa<Fd can be satisfied. The relation Fc<Fb indicates the comparison of the thicknesses of the etched portion and the non-etched portion of the etching stopper (insulator layer 1122). The insulator layer 1122 as a silicon nitride layer or silicon carbide layer provides higher density and larger stress than the insulator layers 1121 and 1122 as silicon oxide layers. Thus, it is desirable that the volume existing in proximity to the bonding surface 400 is as small as possible. Accordingly, it is desirable that the etched portion is thicker than the non-etched portion. As a result, the relation Fc<Fb can be satisfied. The relation Fa<Fb indicates the comparison of the thicknesses of the insulator layers 1121 and 1122 existing around the pad 311. The controllability for the shape of the pad 311 can be improved by defining the shape of the pad 311 by using the insulator layer 1122 as an etching stopper. For example, when Fa is larger than Fb (Fa>Fb), the insulator layer 1121 is over-etched in etching of the insulator layer 1122, and the trench width of the insulator layer 1121 is likely to be larger than that of the insulator layer 1122. When Fb is larger than Fa (Fa<Fb) is applied, the side surface of the trench where the pad 311 is disposed can be brought close to the perpendicular, which is advantageous to the miniaturization of the pad 311. The relation Fc<Fd indicates the comparison of the thicknesses of the insulator layers 1122 and 1123 existing around the vias 312. To satisfy the above-described Fa<Fd, Fc<Fb, and Fc<Fd, it is realistic to satisfy Fc<Fd.

The thickness Fa of the insulator layer 1121 is, for example, 100 to 300 nm. The thickness Fb+Fc of the insulator layer 1122 is, for example, 300 to 500 nm. The thickness Fd of the insulator layer 1123 is, for example, 400 to 800 nm, the thickness Fb is, for example, 200 to 400 nm, and the thickness Fc is, for example, 50 to 150 nm.

The configuration of the conductive portion 213 will be described in detail below. The conductive portion 213 includes a copper region 3211 mainly made of copper for forming the pad 321, and a copper region 3221 mainly made of copper for forming the vias 322. The conductive portion 213 includes a barrier metal portion 3212 positioned between the copper region 3211 and the insulator film 112, and a barrier metal portion 3222 positioned between the copper region 3221 and the insulator film 112. The copper region 3211 is continuous to the copper region 3221. The barrier metal portion 3212 is continuous to the barrier metal portion 3222. The barrier metal portions 3212 and 3212 are parts of the continuous barrier metal film 3202. One pad 321 is surrounded by the insulator film 112 in the X-Y plane. The contour of one pad 321 coincides with the contour of the insulator film 212 surrounding the one pad 321. Mb vias 322 (Mb is a natural number) are connected to one pad 321 included in each conductive portion 213. While Mb is 4 in the present exemplary embodiment, Mb may be 1 or 2. Although it is desirable that Mb is equal to Ma, Ma and Mb may be different. The above-described length La and width Wa indicate the length and the width of one via out of the Ma vias 322. If Ma is larger than two (Ma>2) and one via has the length La and the width Wb, the other vias do not necessarily need to coincide with the length La and the width Wa but it is desirable that the other vias coincide with the length La and the width Wb.

The insulator film 212 can be a stacked film including the insulator layers 2121, 2122, and 2123. The insulator layer 2123 is disposed between the insulator layer 2121 and the semiconductor layer 200 in the stacking direction Z. The insulator layer 2122 is disposed between the insulator layers 2121 and 2123 in the stacking direction Z. The insulator layer 2121 surrounds the pad 321 in the X-Y plane. The insulator layer 2123 surrounds the vias 322 in the X-Y plane in the stacking direction Z. The insulator layer 2122 includes a pad surrounding portion which surrounds the pad 321 in the X-Y plane. The insulator layer 2122 is positioned between the insulator layer 2123 and the pad 321 in the X-Y plane and includes the via surrounding portion which surrounds the vias 322.

The insulator layer 2121 has a thickness Fe, the pad surrounding portion of the insulator layer 2122 has a thickness Ff, the via surrounding portion of the insulator layer 2122 has a thickness Fg, and the portion of the insulator layer 2123 overlapping with the pad 321 has a thickness Fh. As in the insulator film 112, it is desirable that etching is performed so that at least two of Fe, Ff, Fg, and Fh satisfy at least a part of the relation Fh>Ff>Fe≥Fg>0.

According to the present exemplary embodiment, the distance Da between the semiconductor layer 100 and the conductive portion 213 is larger than the distance Db between the semiconductor layer 200 and the conductive portion 113 (Da>Db). When the distance Da is larger than the distance Db, the resistance of the interlayer wiring in the wiring structure 010 can be larger than the resistance thereof in the wiring structure 020. Thus, the vias 312 of the bonding member 411 included in the wiring structure 010 are configured so as to provide a lower resistance than the vias 322 of bonding member 421 included in the wiring structure 020. This enables reducing the unbalance between the resistance of the interlayer wiring in the wiring structure 010 and the resistance thereof in the wiring structure 020 even if the distance Da is larger than the distance Db. The distance Da between the semiconductor layer 100 and the conductive portion 213 may be equal to the distance Db between the semiconductor layer 200 and the conductive portion 113 (Da=Db). This enables reducing the unbalance between the resistance of the interlayer wiring in the wiring structure 010 and the resistance thereof in the wiring structure 020. The present exemplary embodiment is also applicable to a case where the number of wiring layers, Na, is larger than the number of wiring layers, Nb, (Na>Nb).

According to the present exemplary embodiment, the number of wiring layers, Na, between the semiconductor layer 100 and the conductive portion 113 is three (Na=3), namely, the conductor layer 111 and the wiring layers 107 and 105. The number of wiring layers, Nb, between the semiconductor layer 200 and the conductive portion 213 is three (Nb=3), namely, the conductor layer 211 and the wiring layers 207 and 205. Accordingly, the relation Na=Nb results. This enables reducing the unbalance between the resistance of the interlayer wiring in the wiring structure 010 and the resistance thereof in the wiring structure 020. The number of wiring layers, Na, between the semiconductor layer 100 and the conductive portion 113 may be larger than the number of wiring layers, Nb, between the semiconductor layer 200 and the conductive portion 213 (Na>Nb). When the number of wiring layers, Na, is larger than the number of wiring layers, Nb, the resistance of the interlayer wiring in the wiring structure 010 can be larger than the resistance thereof in the wiring structure 020. Thus, the vias 312 of the bonding member 411 included in the wiring structure 010 are configured so as to provide a lower resistance than the vias 322 of the bonding member 421 included in the wiring structure 020. This enables reducing the unbalance between the resistance of the interlayer wiring in the wiring structure 010 and the resistance thereof in the wiring structure 020 even if the number of wiring layers, Na, is larger than the number of wiring layers, Nb. The present exemplary embodiment is also applicable to a case where the number of wiring layers, Na, is smaller than the number of wiring layers, Nb, (Na<Nb).

The semiconductor layer 100 is provided with an element isolation portion 101 and a plurality of transistors. The surface where the plurality of transistors is provided out of a plurality of surfaces of the semiconductor layer 100 is the principal surface of the semiconductor layer 100. The principal surface may be referred to as a surface, and the surface opposite to the principal surface may also be referred to as a rear surface. In a semiconductor apparatus APR as a photoelectric conversion apparatus, the integrated circuit of the semiconductor layer 100 can include signal processing circuits for pixel signal processing, such as an analog signal processing circuit, an analog-to-digital (AD) conversion circuit, a noise removal circuit, and a digital signal processing circuit. The semiconductor layer 100 can be referred to as a "substrate" or "semiconductor substrate".

The element isolation portion 101 has the Shallow Trench Isolation (STI) structure and defines an element region (active region) of the semiconductor layer 100. A plurality of transistors 120 can configure a complementary metal oxide semiconductor (CMOS) circuit. A source/drain 121 of a transistor 120 can have a silicide layer 122, such as a cobalt silicide layer or nickel silicide layer. The gate electrode 102 of the transistor 120 can have a silicide layer, metal layer, and metal compound layer. The gate insulating film of the transistor 120 can be a silicon oxide film, silicon nitride film, or metal oxide film.

The semiconductor layer 200 is provided with element isolation portions 201, gate electrodes 202, photodiodes 220, and sources/drains 221. The surface where a plurality of transistors is provided out of a plurality of surfaces of the semiconductor layer 200 is the principal surface of the semiconductor layer 200. The principal surface may be referred to as a surface, and the surface opposite to the principal surface may be referred to as a rear surface. The semiconductor layer 200 can be referred to as a "substrate" or "semiconductor substrate".

The element isolation portion 201 has the STI structure and defines an element region (active region) of the semiconductor layer 200. The gate electrode 202 transfers charges of the photodiode 220 to the floating diffusion. The semiconductor layer 200 is provided with a pixel circuit for converting charges generated by the photodiode 220 into a pixel signal. The pixel circuit can include pixel transistors, such as a reset transistor, amplification transistor, and selection transistor. A pixel signal according to the charges transferred to the floating diffusion is generated by the amplification transistor. The potential of the floating diffusion is reset to the reset potential by the reset transistor.

The conductive portion 113 is electrically connected to the semiconductor layer 100 via the silicide layer 122 as a cobalt silicide layer or nickel silicide layer. According to the present exemplary embodiment, the contact plug 104, to which the conductive portion 113 is connected, is formed through a salicide process and is in contact with a silicide layer 1001 spreading between the interlayer insulating film 103 and the semiconductor layer 100. On the other hand, the conductive portion 213 is electrically connected to the semiconductor layer 200 without going through a silicide layer as a cobalt silicide layer or nickel silicide layer. According to the present exemplary embodiment, the contact plug 204, to which the conductive portion 213 is connected, is in contact (ohmic contact) with the semiconductor region of the semiconductor layer 100 formed without going through a salicide process. Alternatively, the conductive portion 213 may be electrically connected to the semiconductor layer 200 via a silicide layer made of titanium silicide or tungsten silicide locally formed under the contact plug 204. When the conductive portion 113 connects with the semiconductor layer 100 via the silicide layer 1001, the contact resistance can become low compared with a case where the conductive portion 213 is connected to the semiconductor layer 200 without going through a silicide layer or via a locally formed silicide layer. Thus, as described above, such unbalance can be reduced by disposing the silicide layer 1001 in the wiring structure 010 (in the semiconductor layer 100) even if Da is larger than Db (Da>Db) or Na is larger than Nb (Na>Nb).

According to the present exemplary embodiment, the semiconductor component 001 includes a digital circuit, and the semiconductor component 002 includes an analog circuit. The semiconductor component 001 may include an analog circuit, and the semiconductor component 002 may include a digital circuit. According to the present exemplary embodiment, the semiconductor layer 200 is provided with a photodiode. A photodiode may be provided not on the semiconductor layer 200 but on the semiconductor layer 100. The photodiode provided on the semiconductor layer 200 is connected to the floating diffusion via a transfer gate. The floating diffusion is connected to the gate of a source follower transistor. An analog pixel signal is output from the source of the source follower transistor. The pixel circuit including the transfer gate and the source follower transistor can be the analog circuit included in the semiconductor component 002. The analog pixel signal is subjected to AD conversion into a digital pixel signal by the AD conversion circuit. The digital pixel signal is subjected to signal processing by a digital signal processing (DSP) circuit. The digital signal processing circuit that performs image processing can be an image processing (ISP) circuit. This digital signal processing circuit can be the digital circuit included in the semiconductor component 001. In addition, the digital circuit included in the semiconductor component 002 can be an interfacing circuit such as a Low Voltage Differential Signaling (LVDS) circuit and a Mobile Industry Processor Interface (MIPI) circuit.

In the semiconductor apparatus APR used as a photoelectric conversion apparatus, a metal oxide film 511, an anti-reflection film 512, an insulating film 513, a color filter 514, and a micro lens 515 are disposed on the semiconductor layer 200. The insulating film 513 can include, for example, a shading film for forming an optical black (OB) region, for example, with a metal film made of tungsten, and a shading wall for light separation to prevent color mixing of light for each pixel. The semiconductor apparatus APR according to the present exemplary embodiment is a CMOS image sensor of the rear surface irradiation type with the rear surface of the semiconductor layer 200 as a light receiving surface. The semiconductor apparatus APR according to the present invention is, however, not limited to an image sensor. For example, a semiconductor component having an operation circuit and a semiconductor component having a storage circuit may be stacked. Alternatively, a semiconductor component having an operation circuit and/or a memory circuit, and a semiconductor component having a control circuit for controlling the former semiconductor component may be stacked. The operation circuit is, for example, a central processing unit (CPU) or application specific integrated circuit (ASIC), and the storage circuit is a static random access memory (SRAM) or dynamic random access memory (DRAM).

A method for manufacturing the semiconductor apparatus 930 will be described below. A method for manufacturing a wafer 81 for the semiconductor component 001 and a method for manufacturing a wafer 82 for the semiconductor component 002 will be described below. A method for manufacturing the semiconductor apparatus 930 using the two wafers 81 and 82 will be described below.

A method for manufacturing the wafer 81 for the semiconductor component 001 will be described below with reference to FIGS. 3A, 3B, 3C, and 3D.

The wafer 81 for the semiconductor component 001 illustrated in FIG. 3A is prepared. The wafer 81 includes the semiconductor layer 100, the element isolation portions 101, the transistors 102 (gate electrodes), the interlayer insulating film 103, and the contact plugs 104. The wafer 81 further includes the wiring layer 105, the interlayer insulating film 106, the wiring layer 107, and the via plugs 108 for connecting the wiring layers 105 and 107. A typical configuration is available for the wafer 81, and thus, a description of a method for manufacturing the wafer 81 will be omitted. The interlayer insulating film 109 is formed on the interlayer insulating film 106. Examples of the interlayer insulating film 109 include a silicon oxide film, silicon nitride film, silicon oxynitride film, carbon-containing silicon oxide film, and fluorine-containing silicon oxide film. The layer structure of the film may be a single layer structure made of one material or a multilayer structure made of a plurality of materials.

Trenches are then formed through etching from the surface of the interlayer insulating film 109, and a conductive portion is formed over the entire surface through the PVD and Chemical Vapor Deposition (CVD) methods. As a result, the trenches are filled with a conductive material. By removing the surface conductive portion through the chemical mechanical polishing and etch back, the via plug 110 is formed on the interlayer insulating film 109, as illustrated in FIG. 3A.

A conductor film is then formed on the interlayer insulating film 109. The material of the conductor film may be aluminum. The conductor film on the interlayer insulating film 109 is subjected to patterning. The patterning is implemented through photolithography and etching, and the conductor layer 111 is formed. While three different layers including the wiring layers 105 and 107 and the conductor layer 111 are used in the present exemplary embodiment, any number of wiring layers can be selected. While only a MOS transistor is disposed on the surface of the semiconductor layer 100 in the present exemplary embodiment, the present exemplary embodiment is not limited thereto. For example, a MOS capacitor, a trench capacitor, a resistor using part of the semiconductor layer 100, and a resistor using the transistor 102 (gate electrode) can be disposed. A Metal-Insulator-Metal (MIM) capacitor can also be disposed between wiring layers.

The insulator film 112 is then formed on the interlayer insulating film 109. Examples of the insulator film 112 include a silicon oxide film, silicon nitride film, silicon oxynitride film, carbon-containing silicon oxide film, and fluorine-containing silicon oxide film. For example, dimensional variations of the conductive portion 113 can be reduced by forming a silicon oxide film and then performing flattening through the chemical mechanical polishing.

A plurality of recessed portions 1130 for embedding a conductive material is then formed on the insulator film 112 as illustrated in FIG. 3B. At least part of the plurality of the recessed portions 1130 is formed to reach the conductor layer 111. These recessed portions 1130 are disposed with an appropriate concentration over the entire chip. A recessed portion 1130 is formed of a trench 1311 corresponding to the pad 311 and a hole (via hole) 1312 corresponding to a via 312 in the recessed portion 1130. An etching method for dual damascene can be adopted for forming the recessed portions 1130. Applicable methods for forming the recessed portions 1130 include a via first method for forming the hole 1312 and then forming the trenches 1311, a trench first method for forming the trenches 1311 and then forming the hole 1312, and a method for forming the hole 1312 and the trenches 1311 at the same time. To improve the precision of shape control for the vias 312, it is desirable to firstly form a resist pattern defined by a photomask corresponding to the hole 1312 and then form a resist pattern defined by a photomask corresponding to the trenches 1311. For the portions where recessed portions 1140 corresponding to the conductive portions 114 are formed, in forming the trenches 1311, the recessed portions 1140 corresponding to the conductive portions 114 may be formed, and mask these portions in forming the hole 1312.

At this timing, the recessed portions 1130 are formed on the conductive portions 113 when the recessed portions 1130 are filled with a conductive material in the following process. For this reason, it is desirable that the recessed portion 1130 is formed so that the volumes and thicknesses of the trench 1311 corresponding to the pad 311 and the hole (through-hole) 1312 corresponding to the via 312 in the recessed portion 1130 satisfy the following relation. It is desirable that the depth of the hole 1312 is larger than the depth of the trench 1311.

As illustrated in FIG. 3C, a conductive material 1131 is formed over the entire surface. In this case, the recessed portion 1130 is filled with the conductive material 1131. The material of the conductive material 1131 can be copper.

As illustrated in FIG. 3D, excesses of the conductive material 1131 is removed through the chemical mechanical polishing method to form the conductive portions 113. More specifically, the pads 311 and the vias 312 disposed at the bottom of the pads 311 are formed. The thickness Ta of the pad 311 of the conductive portion 113 coincides with the depth of the trench 1311. The length La of the via 312 coincides with the depth of the hole 1312 from the bottom of the trench 1311. The width Pa of the pad 311 coincides with the width of the trench 1311, and the width Wa of the via 312 coincides with the width of the hole 1312. If the dimensions of the trench 1311 and the hole 1312 in the recessed portion 1130 have been adjusted, the conductive portion 113 satisfying the above-described relation can be formed. Through the above-described process, the wafer 81 for the semiconductor component 001 before the bonding is completed. Since the conductive portions 113 are formed with an appropriate concentration over the entire chip in this chemical mechanical polishing, dishing and erosion due to the chemical mechanical polishing are prevented. This improves the flatness of the surface of the wafer 81 for the semiconductor component 001 before the bonding, thus improving yield in the wafer bonding. The uppermost surface of the wafer 81 for the semiconductor component 001 can include the conductive portions 113 and the insulator film 112 in a flattened state. More specifically, the distance from the uppermost surface of the wafer 81 for the semiconductor component 001 to the conductive portions 113 and the insulator film 112 can be zero. However, a semiconductor wafer may be stored or shipped in a state where a coating film for covering the conductive portions 113 and the insulator film 112 are formed, before performing bonding (described below). The thickness of the coating film may be smaller than the thickness of the pads 311, for example, 500 nm or less, 50 nm or less, or 5 nm or more. The thickness of the coating film can be equivalent to the distance from the uppermost surface (most front surface) of the wafer 81 for the semiconductor component 001 to the conductive portions 113 and the insulator film 112. The distance from the uppermost surface of the wafer 81 for the semiconductor component 001 to the conductive portions 113 and the insulator film 112 may be smaller than the thickness of the pads 311, for example, 500 nm or less, 50 nm or less, or 5 nm or more.

A method for manufacturing the wafer 82 for the semiconductor component 002 will be described below with reference to FIGS. 4A, 4B, 4C, and 4D.

Figure 4A:
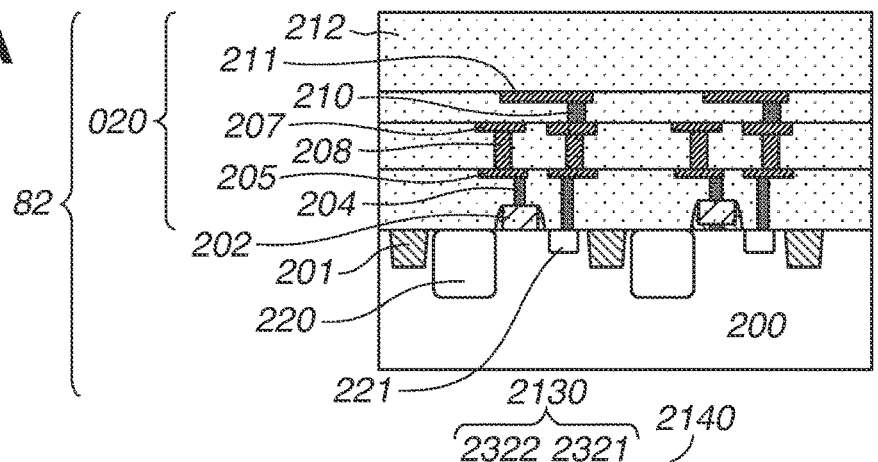
FIGS. 4A, 4B, 4C, and 4D schematically illustrate another method for manufacturing the semiconductor apparatus.

The wafer 82 as a part of the wafer 82 for the semiconductor component 002 illustrated in FIG. 4A is prepared. The wafer 82 includes the semiconductor layer 200, the element isolation portions 201, the gate electrodes 202, the interlayer insulating film 203, and the contact plugs 204. The semiconductor layer 200 is provided with the photodiodes 220 and the sources/drains 221. The wafer 82 further includes the wiring layer 205, the interlayer insulating film 206, the wiring layer 207, and the via plugs 208 for connecting the wiring layers 205 and 207. The wafer 82 further includes the interlayer insulating film 209, the conductor layer 211, and the via plugs 210 for connecting the wiring layer 207 and 211. The wafer 82 can be manufactured through a typical technique, and thus, a description of a method for manufacturing the wafer 82 will be omitted.

While only a MOS transistor is disposed on the surface of the semiconductor layer 200 in the present exemplary embodiment, the element to be disposed is not limited thereto. For example, a MOS capacitor, a trench capacitor, a resistor using part of the semiconductor layer 200, and a resistor using the gate electrode 202 can be disposed. An MIM capacitor can also be disposed between wiring layers.

The insulator film 212 is formed on the interlayer insulating film 209. Examples of the insulator film 212 include a silicon oxide film, silicon nitride film, silicon oxynitride film, carbon-containing silicon oxide film, and fluorine-containing silicon oxide film.

Figure 4B:
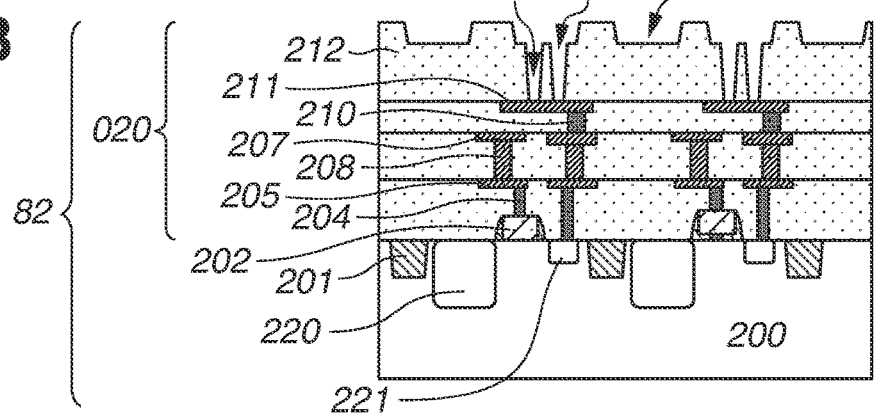

Then, as illustrated in FIG. 4B, a plurality of the recessed portions 2130 for embedding a conductive material is formed on the insulator film 212. At least a part of the plurality of the recessed portions 2130 is formed to reach the conductor layer 211. These recessed portions 2130 are disposed with an appropriate concentration over the entire chip. For this reason, it is desirable that the volumes and thicknesses of a trench 2311 corresponding to the pad 321 and a hole 2322 corresponding to a via 322 in the recessed portion 2130 satisfy the above-described relation. The recessed portion 2130 may be formed through a method similar to the above-described method for the recessed portion 2130 corresponding to the conductive portion 213 and a recessed portion 2140 corresponding to the conductive portion 214.

Figure 4C:
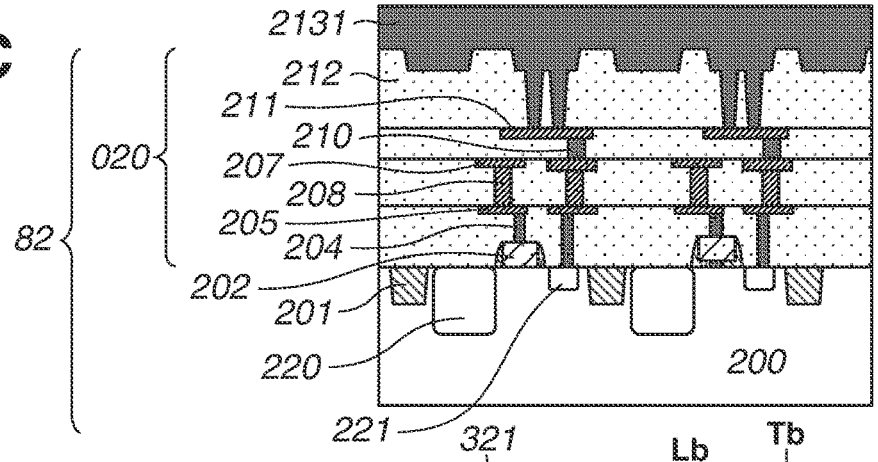

As illustrated in FIG. 4C, a conductive material 2131 is formed over the entire surface of the insulator film 212. In this case, the recessed portion 2130 is filled with the conductive material 2131. The material of the conductive material 2131 can be copper.

Figure 4D:
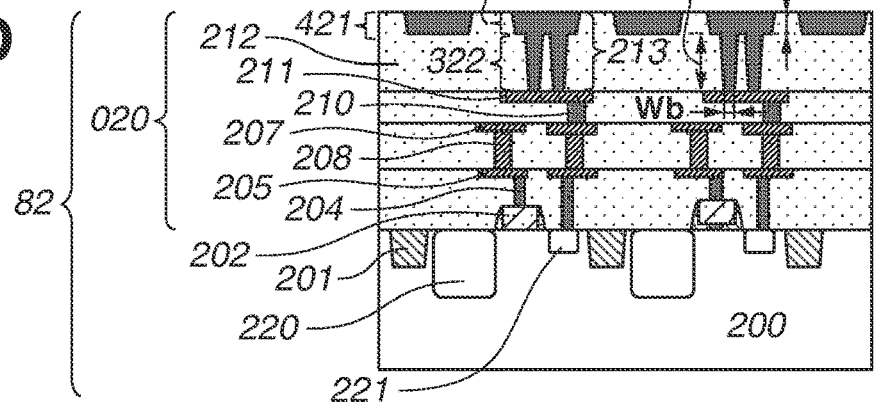

As illustrated in FIG. 4D, excesses of the conductive material 2131 is removed through the chemical mechanical polishing method, and the conductive portions 213 connected to the conductor layer 211 is formed. More specifically, the pad 321 and the via 322 disposed at the bottom of pad 321 are formed. The thickness Tb of the pad 321 of the conductive portion 213 coincides with the depth of the trench 2321. The length Lb of the via 322 coincides with the depth of the hole 2322 from the bottom of the trench 2321. The width Pb of the pad 321 coincides with the width of the trench 2321, and the width Wb of the via 322 coincides with the width of hole 2322. If the dimensions of the trench 2321 and the hole 2322 in the recessed portion 2130 have been adjusted, the conductive portion 213 satisfying the above-described relation can be formed. With the above-described process, the wafer 82 for the semiconductor component 002 before the bonding is completed. The recessed portions 2130 are disposed over the entire chip in this chemical mechanical polishing, and thus, dishing and erosion through the chemical mechanical polishing are prevented. This improves the flatness on the surface of the wafer 82 for the semiconductor component 002 before the bonding. The uppermost surface of the wafer 82 for the semiconductor component 002 can include the conductive portions 213 and the insulator film 212 in a flattened state. More specifically, the distance from the uppermost surface of the wafer 82 for the semiconductor component 002 to the conductive portion 213 and the insulator film 212 can be zero. However, a semiconductor wafer may be stored or shipped in a state where a coating film for covering the conductive portions 213 and the insulator film 212 are formed before performing bonding (described below). The thickness of the coating film may be smaller than the thickness of the pad 321, for example, 500 nm or less, 50 nm or less, or 5 nm or more. The thickness of the coating film can be equivalent to the distance from the uppermost surface of the wafer 82 for the semiconductor component 002 to the conductive portions 213 and the insulator film 212. The distance from the uppermost surface of the wafer 82 for the semiconductor component 002 to the conductive portion 213 and the insulator film 212 may be smaller than the thickness of the pad 321, for example, 500 nm or less, 50 nm or less, or 5 nm or more.

Figure 5:
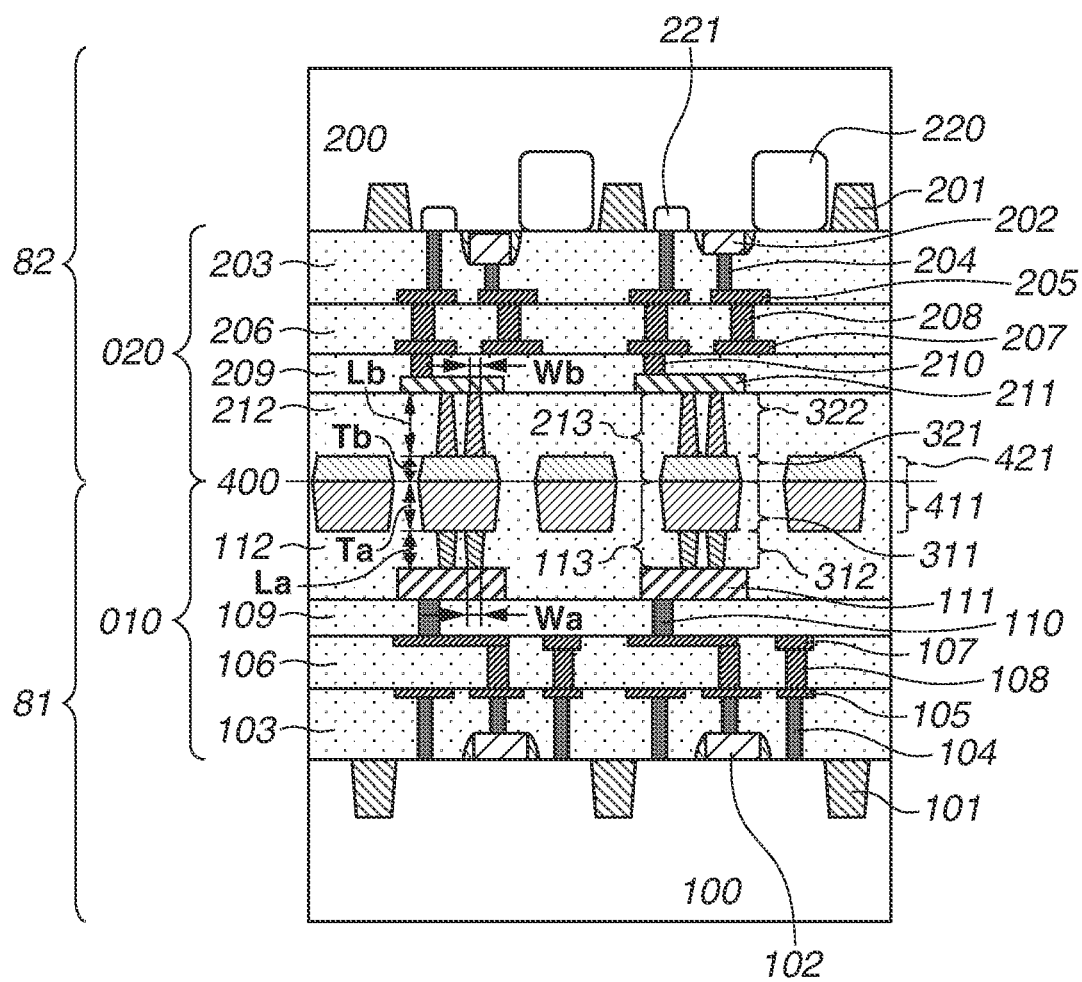
FIG. 5 schematically illustrates another method for manufacturing the semiconductor apparatus.

A method for manufacturing the semiconductor apparatus 930 will be described below with reference to FIG. 5. As illustrated in FIG. 5, the wafer 82 for the semiconductor component 002 is reversed, and the wafer 81 for the semiconductor component 001 and the wafer 82 for the semiconductor component 002 are bonded to each other on the bonding surface 400. In the resultant structure after the bonding, the wafer 82 for the semiconductor component 002 is stacked on the wafer 81 for the semiconductor component 001. For example, in wafer bonding, the insulator films 112 and 212 on the bonding surface of the wafer are activated through plasma activation, and then the activated insulator films 112 and 212 are bonded to each other, resulting in the temporary bonding of the semiconductor wafers 81 and 82. Then, for example, when heat processing at 350 degrees Celsius is performed, the insulator films 112 and 212 on the bonding surface 400 are more solidly bonded to each other than in the temporary bonding. The conductive portions 113 and 213 are bonded to each other through mutual diffusion of copper between the conductive portions 113 and 213. The bonding of the insulator films 112 and 212 can be implemented through chemical bonding, such as intermolecular forces and covalent bonding, fusion-based unification of the insulator films 112 and 212, and the adhesion by an adhesive material. The insulator films 112 and 212 may be separate from each other. The bonding of the conductive portions 113 and 213 can be implemented through metallic bonding. In the heat processing for bonding semiconductor components 001 and 002, the above-described technique enables preventing the detachment from the bonding interface due to the influence of the thermal expansion of the conductive portion 113 or 213. Thus, the bonding reliability of the semiconductor apparatus APR can be improved.

The lengths of the vias 312 and 322 are defined to satisfy the relation La<Lb. Defining the widths of the vias 312 and 322 to satisfy the relation Wa>Wb enables reducing the junction resistance between the bonding portion and the wiring layer and preventing the resistance variation while improving the bonding reliability in the semiconductor apparatus. Alternatively, defining the thicknesses of the pads 311 and 321 to satisfy the relation Ta>Tb enables reducing the junction resistance between the bonding portion and the wiring layer and preventing the resistance variation while improving the bonding reliability in the semiconductor apparatus. Making the ratio of the length La to the length Lb smaller than the ratio of the thickness Ta to the thickness Tb (La/Lb<Ta/Tb) enables preventing the detachment from the bonding surface 400 under the influence of the thermal expansion of the conductive portions. Further, making the difference between the lengths La and Lb larger than the difference between the thicknesses Ta and Tb enables preventing the detachment from the bonding surface 400 due to the influence of the thermal expansion of the conductive portions. This is because the volumes of the vias are relatively smaller than the volumes of the trenches in the conductive portions 113 and 213. When the lengths of the vias 312 and 322 are defined to satisfy the relation La<Lb, the definition is made so that the ratio of the length La to the length Lb is larger than the ratio of the thickness Tb to the thickness Ta (Tb/Ta<La/Lb). This enables preventing the detachment from the bonding surface 400 due to the influence of the thermal expansion of the conductive portions. Further, making the difference between the lengths La and Lb larger than the difference between the thicknesses Ta and Tb enables preventing the detachment from the bonding surface 400 due to the influence of the thermal expansion of the conductive portions. This is because the volumes of the vias are relatively smaller than the volumes of the trenches in the conductive portions 113 and 213.

For example, in the case of Na>Nb, satisfying the relation La<Lb enables reducing the junction resistance between the bonding portion and the wiring layer and preventing the resistance variation while improving the reliability of the bonding portion in the semiconductor apparatus. Similarly, satisfying the relation Wa>Wb enables reducing the junction resistance between the bonding portion and the wiring layer and preventing the resistance variation while improving the reliability of the bonding portion in the semiconductor apparatus.

In the case of Da>Db, satisfying the relation La<Lb enables reducing the junction resistance between the bonding portion and the wiring layer and preventing the resistance variation while improving the reliability of the bonding portion in the semiconductor apparatus. Similarly, satisfying the relation Wa>Wb enables reducing the junction resistance between the bonding portion and the wiring layer and preventing the resistance variation while improving the reliability of the bonding portion in the semiconductor apparatus.

For example, in the case of Na<Nb, satisfying the relation La>Lb enables reducing the junction resistance between the bonding portion and the wiring layer and preventing the resistance variation while improving the reliability of the bonding portion in the semiconductor apparatus. Similarly, satisfying the relation Wa<Wb enables reducing the junction resistance between the bonding portion and the wiring layer and preventing the resistance variation while improving the reliability of the bonding portion in the semiconductor apparatus.

Further, in the case of Da<Db, satisfying the relation La>Lb enables reducing the junction resistance between the bonding portion and the wiring layer and preventing the resistance variation while improving the reliability of the bonding portion in the semiconductor apparatus. Similarly, satisfying the relation Wa<Wb enables reducing the junction resistance between the bonding portion and the wiring layer and preventing the resistance variation while improving the reliability of the bonding portion in the semiconductor apparatus.

As illustrated in FIG. 1A, the thickness of the semiconductor layer 200 is thinned to several ten to several µm. Examples of thinning methods include back grind, chemical mechanical polishing, and etching. The metal oxide film 511, the antireflection film 512, and the insulating film 513 are formed on the surface of the semiconductor layer 200 of the wafer 82 for the semiconductor component 002. The metal oxide film 511 is, for example, a hafnium oxide film and aluminum oxide film. The antireflection film 512 is, for example, a tantalum oxide film. The insulating film 513 can be selected from any materials generally used in the semiconductor apparatus. Examples of the materials of the insulator film 513 include a silicon oxide film, silicon nitride film, silicon oxynitride film, carbon-containing silicon oxide film, and fluorine-containing silicon oxide film. The layer structure of the film may be a single layer structure made of one material or a multilayer structure made of a plurality of materials. Although not illustrated, the insulating film 513 may include therein, for example, a shading film for forming an OB region, for example, with a metal film made of tungsten, and a shading wall for light separation to prevent color mixing of light for each pixel. The color filter 514 and the micro lens 515 may be formed on the semiconductor layer 200. Apertures (pad apertures) reaching pad electrodes included in the wiring structure 010 or 020 may be formed on the semiconductor layer 200. A through-via (TSV) penetrating through the semiconductor layer 100 and connecting to an electrode included in the wiring structure 010 or 020 may be formed on the semiconductor layer 100.

Subsequently, a stacked body of the two semiconductor wafers bonded to each other via the conductive portions 113 and 213 is diced to be individualized to a plurality of semiconductor device ICs. In each of the semiconductor device ICs individualized in this way, the semiconductor component 001 as a chip acquired from the wafer 81 for the semiconductor component 001 and the semiconductor component 002 as a chip acquired from the wafer 82 for the semiconductor component 002 are stacked (bonded to each other). Although the present exemplary embodiment has been described above centering on the semiconductor apparatus 930 including the two stacked (bonded) semiconductor components 001 and 002, the semiconductor apparatus 930 may include three or more stacked (bonded) semiconductor components. In such a case, elements (semiconductor components) are also bonded to one another with conductive portions and insulating films. The bonding reliability can be improved by applying the above-described favorable bonding conditions to the conductive portions. Although the present exemplary embodiment has been described above centering on a form in which semiconductor components are bonded to each other at the wafer level and then the wafers are diced, each wafer may be separately diced to acquire chips and then the chips may be bonded to each other.

The device 9191 including the semiconductor apparatus 930 as illustrated in FIG. 1B will be described in detail below. The semiconductor apparatus 930 can include the package 920 for storing the semiconductor device 910, in addition to the semiconductor device 910 having the semiconductor layer 100 as described above. The package 920 can include a base substrate with the semiconductor device 910 fixed thereon, and a lid, such as glass facing the semiconductor device 910. The package 920 can further include bonding members, such as a bonding and a bump for connecting terminals on the base substrate and terminals on the semiconductor device 910.

The device 9191 can include at least any of the optical apparatus 940, the control apparatus 950, the processing apparatus 960, the display apparatus 970, the storage apparatus 980, and the mechanical apparatus 990. The optical apparatus 940 corresponds to the semiconductor apparatus 930. The optical apparatus 940 is, for example, a lens, shutter, or mirror. The control apparatus 950 controls the semiconductor apparatus 930. The control apparatus 950 is, for example, a semiconductor apparatus, such as an ASIC.

The processing apparatus 960 processes the signal output from the semiconductor apparatus 930. The processing apparatus 960 is a semiconductor apparatus, such as a CPU and ASIC, for configuring an Analog Front End (AFE) or Digital Front End (DFE). The display apparatus 970 is an electroluminescence (EL) display apparatus or liquid crystal display apparatus for displaying information (images) acquired by the semiconductor apparatus 930. The storage apparatus 980 is a magnetic apparatus or semiconductor apparatus for storing information (images) acquired by the semiconductor apparatus 930. The storage apparatus 980 is a volatile memory, such as an SRAM and DRAM, or a nonvolatile memory, such as a flash memory and hard disk drive.

The mechanical apparatus 990 includes motors, engines, and other movable members or driving members. The device 9191 displays the signal output from the semiconductor apparatus 930 on the display apparatus 970, and transmits the signal to the outside through a communication unit (not illustrated) included in the device 9191. Thus, it is desirable that the device 9191 further includes the storage apparatus 980 and the processing apparatus 960 in addition to the storage circuit and the operation circuit included in the semiconductor apparatus 930. The mechanical apparatus 990 may be controlled based on the signal output from the semiconductor apparatus 930.

The device 9191 is suitable for electronic devices, such as information terminals having image capturing functions (e.g., smart phones and wearable terminals) and cameras (e.g., lens exchange-type cameras, compact cameras, video cameras, and monitoring cameras). The mechanical apparatus 990 in a camera can drive the parts of the optical apparatus 940 to perform zooming, focusing, and shutter. Alternatively, the mechanical apparatus 990 in a camera can move the semiconductor apparatus 930 to perform anti-vibration operations.

The device 9191 can be a transportation device, such as a vehicle, ship, and flying object. The mechanical apparatus 990 in a transportation device can be used as a moving apparatus. The device 9191 as a transportation device is suitable for transporting the semiconductor apparatus 930 and assisting and/or automating operations (maneuvers) using image capturing functions. The processing apparatus 960 for assisting and/or automating operations (maneuvers) can perform processing for operating the mechanical apparatus 990 as a moving apparatus based on information acquired by the semiconductor apparatus 930. Alternatively, the device 9191 may be a medical device, such as an endoscope, a measurement device, such as a distance measuring sensor, an analytical device, such as an electron microscope, and a business device, such as a copying machine.

According to the present exemplary embodiment, the unbalance in the wiring resistance between the semiconductor components 001 and 002 can be reduced. Thus, it is possible to improve the bonding reliability for a plurality of parts in the semiconductor apparatus 930.

Accordingly, the use of the semiconductor apparatus according to the present exemplary embodiment makes it possible to improve the performance of semiconductor apparatuses. Thus, for example, if the semiconductor apparatus according to the present exemplary embodiment is mounted on a transportation devices, excellent reliability can be acquired in capturing images of the outside of the transportation device and measuring the external environment. Therefore, in manufacturing and selling transportation devices, determining to mount the semiconductor apparatus according to the present exemplary embodiment on transportation devices is advantageous to improve the performance of transportation devices.

The above-described exemplary embodiment can be suitably modified without departing from the technical concept thereof. The disclosure of the above-described exemplary embodiment includes not only the descriptions of the present specification but also all of the contents graspable from the present specification and the drawings attached to the present specification.

The present disclosure makes it possible to provide a technique which is advantageous in improving the bonding reliability for a plurality of parts in a semiconductor apparatus.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-039904, filed Mar. 5, 2019, which is hereby incorporated by reference herein in its entirety.

What is claimed is:

1. A semiconductor apparatus comprising:
   a first semiconductor component including a first semiconductor layer and a first insulator film over the first semiconductor layer; and
   a second semiconductor component including a second semiconductor layer and a second insulator film over the second semiconductor layer;
   wherein the first and the second semiconductor layers are stacked so that the first and the second insulator films are positioned between the first and the second semiconductor layers in a first direction,
   wherein the first and the second semiconductor components are bonded to each other by a first conductive portion disposed in a recessed portion formed in the first insulator film and a second conductive portion disposed in a recessed portion formed in the second insulator film,
   wherein the first conductive portion includes a first pad surrounded by the first insulator film in a plane perpendicular to the first direction, and a first via connected to the first pad so that the first via is positioned between the first pad and the first semiconductor layer in the first direction, the first via being connected to a first conductor layer in proximity to the first via, the first conductor layer being positioned between the first via and the first semiconductor layer in the first direction,
   wherein the second conductive portion includes a second pad surrounded by the second insulator film in a plane perpendicular to the first direction, and a second via connected to the second pad so that the second via is positioned between the second pad and the second semiconductor layer in the first direction, the second via being connected to a second conductor layer in proximity to the second via, the second conductor layer being positioned between the second via and the second semiconductor layer in the first direction, wherein at least one of the following relations (A), (B), (C), (D), and (E), at least one of the following relations (α) and (β), and (K) are satisfied:

$$La<Lb, \quad (A)$$

$$Wa>Wb, \quad (B)$$

$$La/Lb<Ta/Tb, \quad (C)$$

$$Pa/Pb<Wa/Wb, \quad (D)$$

$$La/Wa<Lb/Wb, \quad (E)$$

(α) the first conductor layer is mainly made of aluminum,
(β) the second conductor layer is mainly made of copper, and $$|Ta-Tb|<|La-Lb|, \quad (K)$$

where La is a dimension of the first via in the first direction, Lb is a dimension of the second via in the first direction, Ta is a dimension of the first pad in the first direction, Tb is a dimension of the second pad in the first direction, Wa is a dimension of the first via in a second direction perpendicular to the first direction, Wb is a dimension of the second via in the second direction, Pa is a dimension of the first pad in the second direction, and Pb is a dimension of the second pad in the second direction.

2. The semiconductor apparatus according to claim 1, wherein the following relation (G) is satisfied:

$$Ta>Tb, \quad (G)$$

3. The semiconductor apparatus according to claim 1, wherein each of a plurality of the first conductive portions comprises:
a first copper region mainly made of copper for forming the first pad;
a second copper region mainly made of copper for forming the first via;
a first barrier metal portion positioned between the first copper region and the first insulator film; and
a second barrier metal portion positioned between the second copper region and the first insulator film,
wherein the first copper region is continuous to the second copper region, and
wherein the first barrier metal portion is continuous to the second barrier metal portion.

4. The semiconductor apparatus according to claim 1, wherein the first and the second semiconductor components are bonded to each other with the first and the second insulator films.

5. The semiconductor apparatus according to claim 1, wherein the first conductive portion comprises a via different from the first via, and the via is connected to the first pad so that the via is positioned between the first pad and the first semiconductor layer in the first direction, and
wherein the second conductive portion comprises a via different from the second via, and the via is connected to the second pad so that the via is positioned between the second pad and the second semiconductor layer in the first direction.

6. The semiconductor apparatus according to claim 1, wherein the first semiconductor component includes a digital circuit, and
wherein the second semiconductor component includes an analog circuit.

7. The semiconductor apparatus according to claim 1, wherein a photodiode is provided with the first or the second semiconductor layer.

8. The semiconductor apparatus according to claim 1, wherein the relations (A), (C), (α), and (β) are satisfied.

9. A semiconductor apparatus comprising:
a first semiconductor component including a first semiconductor layer and a first insulator film over the first semiconductor layer; and
a second semiconductor component including a second semiconductor layer and a second insulator film over the second semiconductor layer;
wherein the first and the second semiconductor layers are stacked so that the first and the second insulator films are positioned between the first and the second semiconductor layers in a first direction,
wherein the first and the second semiconductor components are bonded to each other by a first conductive portion disposed in a recessed portion formed in the first insulator film and a second conductive portion disposed in a recessed portion formed in the second insulator film,
wherein the first conductive portion includes a first pad surrounded by the first insulator film in a plane perpendicular to the first direction, and a first via connected to the first pad so that the first via is positioned between the first pad and the first semiconductor layer in the first direction, the first via is connected to a first conductor layer positioned between the first via and the first semiconductor layer in the first direction, and a distance between the first via and the first conductor layer is smaller than a distance between the first via and the second conductive portion,
wherein the second conductive portion includes a second pad surrounded by the second insulator film in a plane perpendicular to the first direction, and a second via connected to the second pad so that the second via is positioned between the second pad and the second semiconductor layer in the first direction, the second via is connected to a second conductor layer positioned between the second via and the second semiconductor layer in the first direction, and a distance between the second via and the second conductor layer is smaller than a distance between the second via and the first conductive portion,
wherein at least one of the following relations (A), (B), (C), (D), and (E), at least one of the following relations (α) and (β), and (K) are satisfied:

$$La<Lb, \quad (A)$$

$$Wa>Wb, \quad (B)$$

$$La/Lb<Ta/Tb, \quad (C)$$

$$Pa/Pb<Wa/Wb, \quad (D)$$

$$La/Wa<Lb/Wb, \quad (E)$$

(α) the first conductor layer is mainly made of aluminum,
(β) the second conductor layer is mainly made of copper, and $$|Ta-Tb|<|La-Lb|, \quad (K)$$

where La is a dimension of the first via in the first direction, Lb is a dimension of the second via in the first direction, Ta is a dimension of the first pad in the first direction, Tb is a dimension of the second pad in the first direction, Wa is a dimension of the first via in a second direction perpendicular to the first direction, Wb is a dimension of the second via in the second direction, Pa is a dimension of the first pad in the second direction, and Pb is a dimension of the second pad in the second direction.

10. The semiconductor apparatus according to claim 9, wherein La and Lb are 0.7 to 0.9 μm, and
wherein Ta and Tb are 0.4 to 0.6 μm.

11. The semiconductor apparatus according to claim 9, wherein the first insulator film comprises:
a first silicon oxide layer;
a second silicon oxide layer disposed between the first silicon oxide layer and the first semiconductor layer in the first direction; and
a silicon nitride layer disposed between the first and the second silicon oxide layers in the first direction,
wherein the first silicon oxide layer surrounds the first pad in the plane perpendicular to the first direction, and
wherein the second silicon oxide layer surrounds the first via in the plane perpendicular to the first direction.

12. The semiconductor apparatus according to claim 11, wherein the silicon nitride layer comprises:
a first portion surrounding the first pad in the plane perpendicular to the first direction, and
a second portion positioned between the second silicon oxide layer and the first pad in the first direction.

13. The semiconductor apparatus according to claim 11, wherein Fa<Fd is satisfied, where Fa is a thickness of the first silicon oxide layer, and Fd is a thickness of a portion of the second silicon oxide layer overlapping with the first pad.

14. The semiconductor apparatus according to claim 12, wherein Fc<Fb is satisfied, where Fb is a thickness of the first portion, and Fc is a thickness of the second portion.

15. The semiconductor apparatus according to claim 12, wherein Fa<Fb and Fc<Fd are satisfied, where Fa is a thickness of the first silicon oxide layer, Fb is a thickness of the first portion, Fc is a thickness of the second portion, and Fd is a thickness of a portion of the second silicon oxide layer overlapping with the first pad.

16. The semiconductor apparatus according to claim 9, wherein a distance between the first semiconductor layer and the first conductive portion is larger than a distance between the second semiconductor layer and the second conductive portion, and/or
wherein the number of wiring layers between the first semiconductor layer and the first conductive portion is larger than the number of wiring layers between the second semiconductor layer and the second conductive portion.

17. The semiconductor apparatus according to claim 9, wherein the first conductive portion is electrically connected to the first semiconductor layer via a cobalt silicide layer or a nickel silicide layer, and
wherein the second conductive portion is electrically connected to the second semiconductor layer without going through a cobalt silicide layer or nickel silicide layer.

18. A semiconductor apparatus comprising:
a first semiconductor component including a first semiconductor layer and a first insulator film over the first semiconductor layer; and
a second semiconductor component including a second semiconductor layer and a second insulator film over the second semiconductor layer;
wherein the first and the second semiconductor layers are stacked so that the first and the second insulator films are positioned between the first and the second semiconductor layers in a first direction,
wherein the first and the second semiconductor components are bonded to each other by a first conductive portion disposed in a recessed portion formed in the first insulator film and a second conductive portion disposed in a recessed portion formed in the second insulator film,
wherein the first conductive portion includes a first pad surrounded by the first insulator film in a plane perpendicular to the first direction, and a first via connected to the first pad so that the first via is positioned between the first pad and the first semiconductor layer in the first direction, the first via is connected to a first conductor layer positioned between the first via and the first semiconductor layer in the first direction, and a distance between the first via and the first conductor layer is smaller than a distance between the first via and the second conductive portion,
wherein the second conductive portion includes a second pad surrounded by the second insulator film in a plane perpendicular to the first direction, and a second via connected to the second pad so that the second via is positioned between the second pad and the second semiconductor layer in the first direction, the second via is connected to a second conductor layer positioned between the second via and the second semiconductor layer in the first direction, and a distance between the second via and the second conductor layer is smaller than a distance between the second via and the first conductive portion,
wherein at least one of the following relations (A), (C), (G), (H), (I), and (J), and at least one of the following relations (α) and (f) are satisfied:

$$La<Lb, \quad (A)$$

$$La/Lb<Ta/Tb, \quad (C)$$

$$Ta>Tb, \quad (G)$$

$$La*Ta>Lb*Tb, \quad (H)$$

$$La-Lb<Ta-Tb, \quad (I)$$

$$La+Ta<Lb+Tb, \quad (J)$$

(α) the first conductor layer is mainly made of aluminum, and
(β) the second conductor layer is mainly made of copper,
where La is a dimension of the first via in the first direction, Lb is a dimension of the second via in the first direction, Ta is a dimension of the first pad in the first direction, and Tb is a dimension of the second pad in the first direction.

19. The semiconductor apparatus according to claim 18, wherein the following relation (F) is satisfied:

$$La/Wa>Lb/Wb, \quad (F)$$

where Wa is a dimension of the first via in a second direction perpendicular to the first direction, and Wb is a dimension of the second via in the second direction.

20. A device comprising:
the semiconductor apparatus according to claim 1; and any one of the following six apparatuses:
- an optical apparatus corresponding to the semiconductor apparatus;
- a control apparatus configured to control the semiconductor apparatus,
- a processing apparatus configured to process a signal output from the semiconductor apparatus,
- a display apparatus configured to display information acquired from the semiconductor apparatus;
- a storage apparatus configured to store information acquired from the semiconductor apparatus; and
- a mechanical apparatus configured to operate based on information acquired from the semiconductor apparatus.

21. A semiconductor apparatus comprising:
a first semiconductor component including a first semiconductor layer and a first insulator film over the first semiconductor layer; and
a second semiconductor component including a second semiconductor layer and a second insulator film over the second semiconductor layer;
wherein the first and the second semiconductor layers are stacked so that the first and the second insulator films are positioned between the first and the second semiconductor layers in a first direction,
wherein the first and the second semiconductor components are bonded to each other by a first conductive portion disposed in a recessed portion formed in the first insulator film and a second conductive portion disposed in a recessed portion formed in the second insulator film,
wherein the first conductive portion includes a first pad surrounded by the first insulator film in a plane perpendicular to the first direction, and a first via connected to the first pad so that the first via is positioned between the first pad and the first semiconductor layer in the first direction, the first via being connected to a first conductor layer in proximity to the first via, the first conductor layer being positioned between the first via and the first semiconductor layer in the first direction,
wherein the second conductive portion includes a second pad surrounded by the second insulator film in a plane perpendicular to the first direction, and a second via connected to the second pad so that the second via is positioned between the second pad and the second semiconductor layer in the first direction, the second via being connected to a second conductor layer in proximity to the second via, the second conductor layer being positioned between the second via and the second semiconductor layer in the first direction, wherein at least one of the following relations (A), (B), (C), (D), and (E), at least one of the following relations ($\alpha$) and ($\beta$), and (L) are satisfied:

$$La < Lb, \tag{A}$$

$$Wa > Wb, \tag{B}$$

$$La/Lb < Ta/Tb, \tag{C}$$

$$Pa/Pb < Wa/Wb, \tag{D}$$

$$La/Wa < Lb/Wb, \tag{E}$$

and
($\alpha$) the first conductor layer is mainly made of aluminum,
($\beta$) the second conductor layer is mainly made of copper, and $$Fh > Fd \tag{L}$$

where $La$ is a dimension of the first via in the first direction, $Lb$ is a dimension of the second via in the first direction, $Ta$ is a dimension of the first pad in the first direction, $Tb$ is a dimension of the second pad in the first direction, $Wa$ is a dimension of the first via in a second direction perpendicular to the first direction, $Wb$ is a dimension of the second via in the second direction, $Pa$ is a dimension of the first pad in the second direction, $Pb$ is a dimension of the second pad in the second direction, $Fd$ is a thickness of a portion surrounding the around the first via and overlapping with the first pad of the first insulator film, and $Fh$ is a thickness of a portion surrounding the around the second via and overlapping with the second pad of the second insulator film.

* * * * *